(12) United States Patent
Park

(10) Patent No.: US 11,024,359 B2
(45) Date of Patent: Jun. 1, 2021

(54) MEMORY DEVICES ADJUSTING OPERATING CYCLE BASED ON OPERATING TEMPERATURE

(71) Applicant: Samsung Electronics Co., Ltd., Suwon-si (KR)

(72) Inventor: Minsang Park, Yongin-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/919,808

(22) Filed: Jul. 2, 2020

(65) Prior Publication Data

US 2021/0134357 A1 May 6, 2021

(30) Foreign Application Priority Data

Oct. 30, 2019 (KR) ........................ 10-2019-0136697

(51) Int. Cl.
*G11C 11/406* (2006.01)
(52) U.S. Cl.
CPC .............................. *G11C 11/40626* (2013.01)
(58) Field of Classification Search
CPC ................................................ G11C 11/40626
See application file for complete search history.

(56) References Cited

U.S. PATENT DOCUMENTS

| | | | |
|---|---|---|---|
| 7,200,062 B2 | 4/2007 | Kinsely et al. | |
| 7,248,527 B2 | 7/2007 | Park | |
| 7,522,464 B2 | 4/2009 | Yoo et al. | |
| 7,532,056 B2 | 5/2009 | Seo | |
| 7,894,289 B2 | 2/2011 | Pawlowski | |
| 8,572,333 B2 | 10/2013 | Confalonieri et al. | |
| 9,514,801 B1 | 12/2016 | Lee | |
| 9,653,145 B1 | 5/2017 | Moon et al. | |
| 2005/0201174 A1* | 9/2005 | Klein ........................ | G11C 7/00 365/222 |

FOREIGN PATENT DOCUMENTS

JP 3712537 11/2005

* cited by examiner

*Primary Examiner* — Jay W. Radke
(74) *Attorney, Agent, or Firm* — Myers Bigel, P.A.

(57) ABSTRACT

A memory device may include a cell array and a cycle calculating circuit. The cycle calculating circuit may calculate an operating cycle of a refresh operation to be performed at the cell array, based on an operating temperature of the memory device. In response to the operating temperature being lower than a first temperature, the cycle calculating circuit may be configured to calculate the operating cycle by integrating one or more slope values of a second slope value to an $n^{th}$ slope value that are arranged from a highest temperature to a lowest temperature. The second slope value may correspond to a second temperature, the $n^{th}$ slope value may correspond to an $n^{th}$ temperature, n may be a natural number of 2 or more, and a number of the one or more slope values may be based on the operating temperature.

20 Claims, 16 Drawing Sheets

| Range | Temperature | Matching value |
|---|---|---|
| $R_1$ | $T_0$ | $C_0$ |
| $R_1$ | $T_1$ | $S_1$ |
| $R_2$ | $T_2$ | $S_2$ |
| ⋮ | ⋮ | ⋮ |
| $R_{m-1}$ | $T_{n-2}, T_{n-1}$ | $S_{m-1}$ |
| $R_m$ | $T_n$ | $S_m$ |

MEMORY DEVICES ADJUSTING OPERATING CYCLE BASED ON OPERATING TEMPERATURE

CROSS-REFERENCE TO RELATED APPLICATION

This application claims priority under 35 U.S.C. § 119 to Korean Patent Application No. 10-2019-0136697 filed on Oct. 30, 2019, in the Korean Intellectual Property Office, the entire contents of which are incorporated by reference herein.

BACKGROUND

Embodiments of the inventive concepts described herein relate to memory devices, and more particularly, relate to memory devices adjusting an operating cycle based on an operating temperature.

The capacity and speed of semiconductor memory devices used in electronic systems are rapidly increasing as semiconductor technologies develop. A semiconductor memory device may be classified as a volatile memory device or a nonvolatile memory device. A typical example of a volatile memory device is a dynamic random access memory (DRAM).

The DRAM stores data in the form of charges that are stored in a cell capacitor. Because the charges stored in the cell capacitor may be leaked out over time, data stored in the DRAM may be lost over time. Accordingly, the DRAM may perform a refresh operation periodically for the purpose of maintaining data stored therein.

The DRAM may control a refresh cycle for the purpose of performing the refresh operation efficiently. However, a large amount of data may be stored in the DRAM, which may lead to complexity in controlling the refresh cycle.

SUMMARY

Embodiments of the inventive concepts provide a memory device adjusting an operating cycle by using a lesser amount of data.

According to an example embodiment, a memory device may include a cell array and a cycle calculating circuit. The cycle calculating circuit may calculate an operating cycle of a refresh operation to be performed at the cell array, based on an operating temperature of the memory device. In response to the operating temperature being lower than a first temperature, the cycle calculating circuit may be configured to calculate the operating cycle by integrating one or more slope values of a second slope value to an $n^{th}$ slope value that are arranged from a highest temperature to a lowest temperature. The second slope value may correspond to a second temperature, the $n^{th}$ slope value may correspond to an $n^{th}$ temperature, n may be a natural number of 2 or more, and a number of the one or more slope values may be based on the operating temperature.

According to an example embodiment, a memory device may include a cell array and a cycle calculating circuit. The cycle calculating circuit may be configured to calculate an operating cycle of a refresh operation to be performed at the cell array based on an operating temperature of the memory device. The cycle calculating circuit may include a code generating circuit that is configured to output a first temperature code and to subsequently output a second temperature code in response to determining that an operating temperature code indicating the operating temperature is not matched to the first temperature code, a matching circuit that is configured to output a slope value corresponding to the second temperature code, and an integrating circuit that is configured to calculate a second cycle corresponding to the second temperature code by adding the slope value to a first cycle corresponding to the first temperature code.

According to an example embodiment, a memory device may include a cell array and a cycle calculating circuit. The cycle calculating circuit may be configured to calculate an operating cycle of a refresh operation to be performed at the cell array based on an operating temperature of the memory device. The cycle calculating circuit may include a comparator that is configured to output a control signal of a first logic value in response to the operating temperature not matching a first temperature, a matching circuit that is configured to output a slope value corresponding to a second temperature in response to the operating temperature not matching the first temperature, and an integrating circuit that is configured to calculate a second cycle corresponding to the second temperature by adding the slope value to a first cycle corresponding to the first temperature code, in response to receiving the control signal of the first logic value.

BRIEF DESCRIPTION OF THE FIGURES

The above and other objects and features of the inventive concepts will become apparent by describing in detail example embodiments thereof with reference to the accompanying drawings.

DETAILED DESCRIPTION

Below, embodiments of the inventive concepts may be described in detail and clearly to such an extent that an ordinary one in the art easily implements the inventive concepts.

Figure 1:
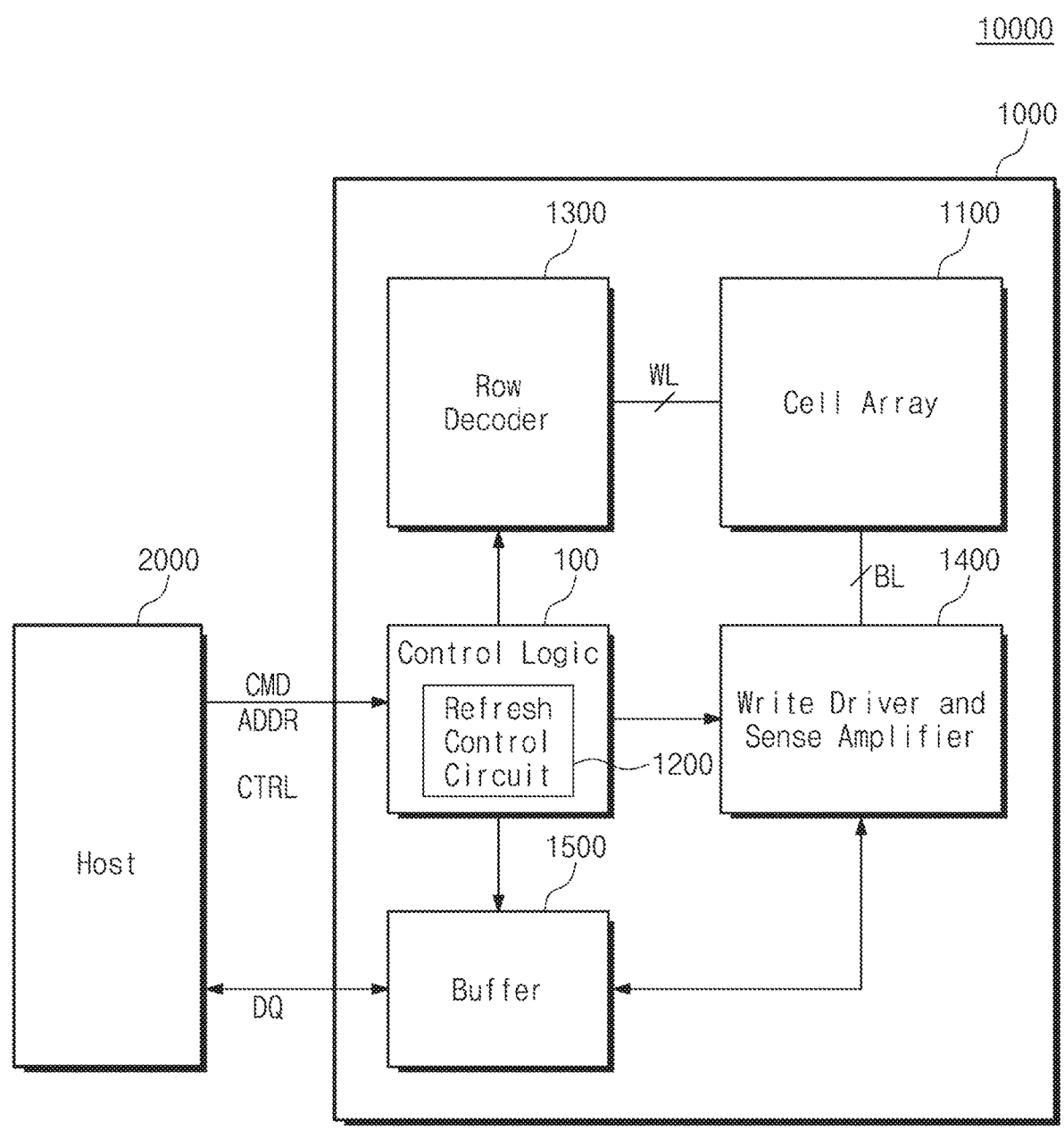
FIG. 1 is a block diagram illustrating an electronic device according to an embodiment of the inventive concepts.

FIG. 1 is a block diagram illustrating an electronic device according to an embodiment of the inventive concepts.

An electronic device 10000 may include a cell array 1100, control logic 100, a row decoder 1300, a write driver and sense amplifier 1400, and a buffer 1500. In some embodiments, the cell array 1100, the control logic 100, the row decoder 1300, the write driver and sense amplifier 1400, and/or the buffer 1500 may be included as part of a memory device 1000.

The cell array 1100 includes memory cells arranged in rows and columns. Memory cells belonging to the rows may be connected to word lines WL, and memory cells belonging to the columns may be connected to bit lines BL. The cell array 1100 may include dynamic random access memory (DRAM) cells, phase-change RAM (PRAM) cells, magnetic RAM (MRAM) cells, ferroelectric RAM (FRAM) cells, and/or resistive RAM (RRAM) cells.

The row decoder 1300 may be connected to the cell array 1100 through the word lines WL. The row decoder 1300 may apply voltages to the word lines WL depending on an address received from the control logic 100.

The write driver and sense amplifier 1400 may be connected to the cell array 1100 through the bit lines BL. Depending on an address received from the control logic 100, the write driver and sense amplifier 1400 may apply voltages to the bit lines BL or may sample voltages of the bit lines BL. The write driver and sense amplifier 1400 may exchange data with the buffer 1500.

The write driver and sense amplifier 1400 may adjust voltages of the bit lines BL depending on data transferred from the buffer 1500 such that the data transferred from the buffer 1500 are stored in memory cells of the cell array 1100. The write driver and sense amplifier 1400 may read data from memory cells of the cell array 1100 by sampling the voltages of the bit lines BL and may transfer the read data to the buffer 1500.

The buffer 1500 may output the transferred data to a host 2000 through a data pad DQ. Also, the buffer 1500 may receive data from the host 2000 through the data pad DQ.

The control logic 100 may control the row decoder 1300, the write driver and sense amplifier 1400, and/or the buffer 1500. The control logic 100 may control the row decoder 1300, the write driver and sense amplifier 1400, and/or the buffer 1500, based on a command CMD, an address ADDR, and a control signal CTRL from the host 2000. In detail, the control logic 100 may control the row decoder 1300, the write driver and sense amplifier 1400, and the buffer 1500 to perform a write operation, a read operation, and/or a refresh operation on the cell array 1100.

The control logic 100 may include a refresh control circuit 1200. The refresh control circuit 1200 according to an embodiment of the inventive concepts may perform a refresh operation in an operating cycle corresponding to an operating temperature of the memory device 1000. The refresh control circuit 1200 may calculate an operating cycle corresponding to an operating temperature, by using temperature-slope data. The refresh control circuit 1200 may transform the temperature-slope data stored in the control logic 100, based on the control signal CTRL. The temperature-slope data will be more fully described with reference to FIG. 5.

For the refresh operation, the refresh control circuit 1200 may output refresh-related signals to the row decoder 1300 and the write driver and sense amplifier 1400. However, to prevent the drawings from being complicated, the refresh control circuit 1200 may be represented in the figures and discussed herein as outputting a refresh signal to the cell array 1100. That the refresh control circuit 1200 outputs the refresh signal to the cell array 1100 means that the refresh control circuit 1200 provides information included in the refresh signal to the row decoder 1300 and the write driver and sense amplifier 1400.

Figure 2:
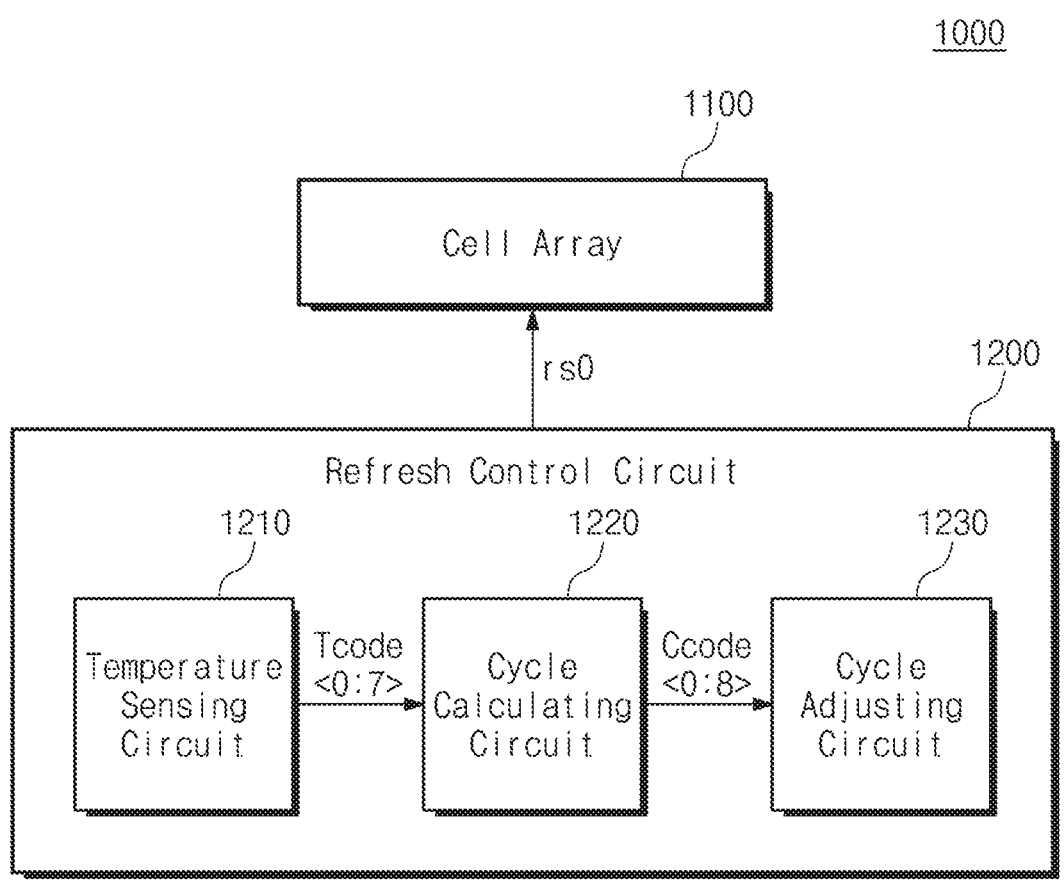
FIG. 2 is a block diagram illustrating components of a refresh control circuit together with a cell array according to an embodiment of the inventive concepts.

FIG. 2 is a block diagram illustrating components of a refresh control circuit 1200 together with a cell array 1100 according to an embodiment of the inventive concepts.

Referring to FIGS. 1 and 2, the memory device 1000 may perform an operation in an operating cycle corresponding to an operating temperature. As used herein, the "operating temperature" may refer to a temperature of the memory device 1000. The refresh control circuit 1200 may obtain information about an operating temperature by using a temperature sensing circuit 1210. As used herein, the "operating cycle" may refer to a cycle in which the memory device 1000 performs a particular operation, at an operating temperature. In some embodiments, an operating cycle of a refresh operation may refer to an operating cycle in which a refresh signal is sent to the cell array 1100.

For example, the memory device 1000 may be a dynamic random access memory (DRAM) device storing data in the cell array 1100. Below, it is assumed that the memory device 1000 is a DRAM, however the inventive concepts are not limited thereto. Also, the descriptions will be given below with regard to an example in which the memory device 1000 performs the refresh operation every operating cycle, however the inventive concepts are not limited thereto. In the case where the memory device 1000 is and/or includes a DRAM, the memory device 1000 may be used as a buffer, a working memory, or a main memory.

The memory device 1000 may perform the refresh operation of the cell array 1100 under control of the refresh control circuit 1200.

The cell array 1100 may store data in the form of charges that are stored in a cell capacitor present in the cell array 1100. The charges stored in the cell capacitor may be leaked out to the outside over time. Accordingly, to maintain the stored data, the memory device 1000 may periodically perform the refresh operation on the cell array 1100. While the refresh operation is performed, a refresh current may flow at the cell array 1100. To reduce refresh current consumption, the memory device 1000 may adjust a refresh cycle based on an operating temperature. The data retention time of the cell array 1100 may increase as an operating temperature decreases. Accordingly, the memory device 1000 may make the refresh cycle relatively great and/or large in a state where an operating temperature is low, thus reducing the refresh current consumption. A great and/or large refresh cycle may mean that a refresh signal is sent to the cell array 1100 less frequently.

The refresh control circuit 1200 may include the temperature sensing circuit 1210, a cycle calculating circuit 1220, and a cycle adjusting circuit 1230. The refresh control circuit

1200 may perform the refresh operation every operating cycle corresponding to an operating temperature.

The temperature sensing circuit 1210 may sense a temperature of the memory device 1000. For example, the temperature sensing circuit 1210 may sense a temperature of a chip in which the temperature sensing circuit 1210 is embedded. The temperature sensing circuit 1210 may transform the sensed operating temperature into an operating temperature code Tcode<0:7>.

Below, the description will be given as the operating temperature code Tcode<0:7> is a code in including 8 bits. However, the inventive concepts are not limited thereto, and an operating temperature code may be a code in which a plurality of bits are included. In detail, the operating temperature code Tcode<0:7> may be one of logic values of "00000000" to "11111111". Operating temperatures may correspond to "00000000" to "11111111" in the order of the highest temperature (e.g., from highest to lowest). For example, in the case where an operating temperature of 120° C. may correspond to the operating temperature code Tcode<0:7> of "00000000", an operating temperature of 100° C. may correspond to the operating temperature code Tcode<0:7> of "00000010". Also, an operating temperature of 0° C. may correspond to the operating temperature code Tcode<0:7> of "11111111".

The cycle calculating circuit 1220 may store temperature-slope data. The cycle calculating circuit 1220 may store the temperature-slope data in storage.

For example, the storage may be a volatile or nonvolatile memory present in the cycle calculating circuit 1220. In the case where the storage is a volatile memory, the memory device 1000 may record the temperature-slope data at the storage whenever the memory device 1000 is reset. In the case where the storage is a nonvolatile memory, the memory device 1000 may transform the temperature-slope data stored in the storage under control of the host 2000 of FIG. 1. An operation in which the memory device 1000 transforms the temperature-slope data stored in the storage under control of the host 2000 will be more fully described with reference to FIG. 19. However, the inventive concepts are not limited to embodiments in which the storage is within the cycle calculating circuit 1220. For example, the storage may be a volatile or nonvolatile memory outside the cycle calculating circuit 1220.

In the description below, the temperature-slope data may refer to data for matching temperatures and slope values. In detail, the temperature-slope data may include temperature data indicating temperatures, slope data indicating slope values, and matching data indicating a correspondence relationship between the temperatures and the slope values. The slope values may indicate the rate of change of an operating cycle relative to a temperature change in each of temperature ranges to which temperatures belong. The temperature-slope data will be more fully described with reference to FIGS. 5 and 6.

The cycle calculating circuit 1220 may receive the operating temperature code Tcode<0:7>. The cycle calculating circuit 1220 may calculate an operating cycle corresponding to an operating temperature, based on the operating temperature code Tcode<0:7> and the temperature-slope data. The operating cycle may be calculated corresponding to an operating temperature sensed by the temperature sensing circuit 1210.

In detail, the cycle calculating circuit 1220 may integrate slope values to calculate an operating cycle. The cycle calculating circuit 1220 may transform the calculated operating cycle into an operating cycle code Ccode<0:8>. Below, it is assumed that the operating cycle code Ccode<0:8> is composed of 9 bits, but the inventive concepts are not limited thereto. Configurations and operations of the cycle calculating circuit 1220 will be described with reference to FIGS. 8 to 12.

The cycle adjusting circuit 1230 may receive the operating cycle code Ccode<0:8>. The operating cycle code Ccode<0:8> may indicate an operating cycle (e.g., of a plurality of possible operating cycles).

The cycle adjusting circuit 1230 may generate a base cycle signal having a base cycle. The cycle adjusting circuit 1230 may transform the base cycle signal into a refresh signal rs0 having an operating cycle. Configurations and operations of the cycle adjusting circuit 1230 will be described with reference to FIGS. 13 to 18.

The refresh control circuit 1200 may refresh the cell array 1100 every operating cycle, by using the refresh signal rs0. In detail, the refresh control circuit 1200 may output the refresh signal rs0 to the row decoder 1300 and the write driver and sense amplifier 1400 of FIG. 1. However, for convenience of description, the expression will be given as the refresh control circuit 1200 outputs the refresh signal rs0 to the cell array 1100.

To sum up, every first cycle, the temperature sensing circuit 1210 may sense an operating temperature and may output the operating temperature code Tcode<0:7>. Every second cycle, the cycle calculating circuit 1220 may generate a reference temperature code and may compare the operating temperature code Tcode<0:7> and the reference temperature code. The second cycle may be smaller than the first cycle. The cycle calculating circuit 1220 may repeatedly perform a comparison operation while increasing a logic value of the reference temperature code from "00000000", until the operating temperature code Tcode<0:7> and the reference temperature code are matched. When the operating temperature code Tcode<0:7> and the reference temperature code are matched, the cycle calculating circuit 1220 may output the operating cycle code Ccode<0:8>. In detail, the cycle calculating circuit 1220 may generate the operating cycle code Ccode<0:8> through a repeated integration operation until the operating temperature code Tcode<0:7> and the reference temperature code are matched. The cycle calculating circuit 1220 may be reset after outputting the operating cycle code Ccode<0:8>. When a new operating temperature code Tcode<0:7> is received after the cycle calculating circuit 1220 is reset, the cycle calculating circuit 1220 may repeatedly perform the comparison operation while increasing a logic value of the reference temperature code from "00000000" every second cycle, until the operating temperature code Tcode<0:7> and the reference temperature code are matched.

Figure 3:
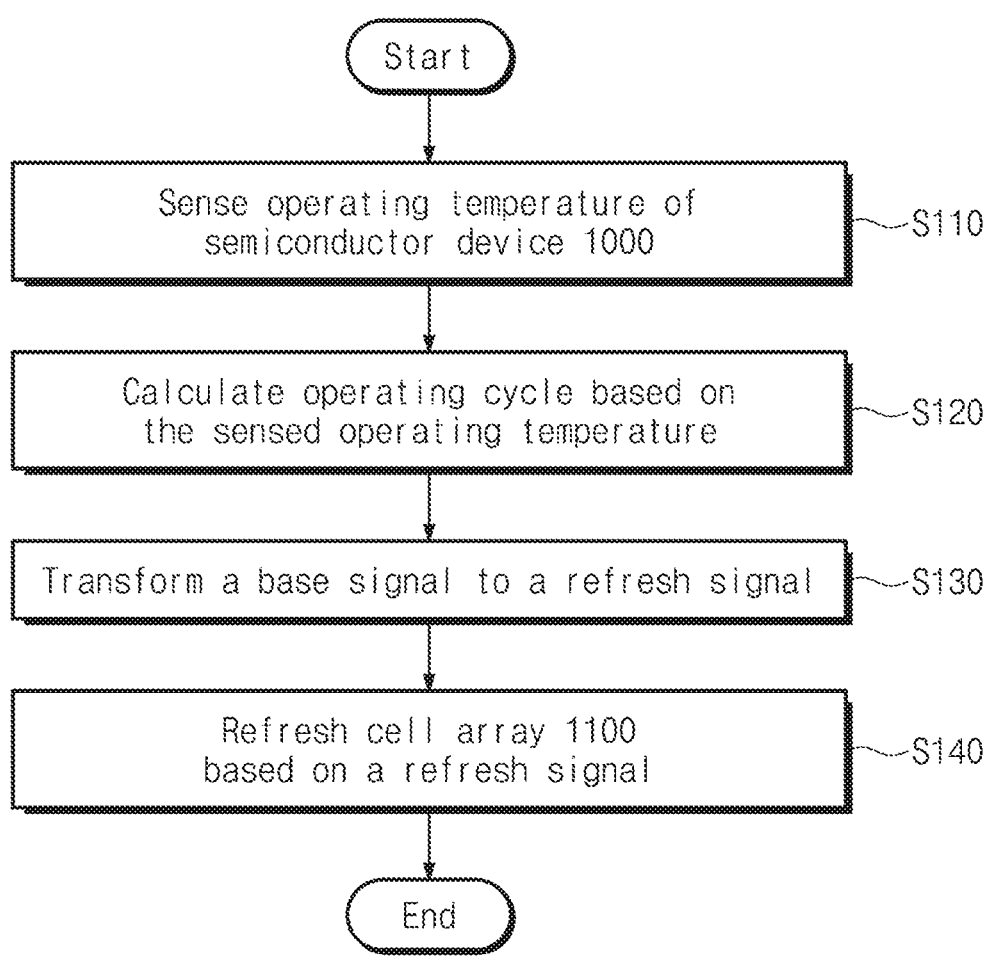
FIG. 3 is a flowchart for describing a method in which a refresh control circuit of FIG. 2 generates a refresh signal.

FIG. 3 is a flowchart for describing a method in which a refresh control circuit 1200 of FIG. 2 generates a refresh signal.

In operation S110, the refresh control circuit 1200 may sense an operating temperature of the memory device 1000. The refresh control circuit 1200 may transform the sensed operating temperature into an operating temperature code.

In operation S120, the refresh control circuit 1200 may calculate an operating cycle, based on the operating temperature code. In detail, the refresh control circuit 1200 may integrate slope values to calculate an operating cycle. The calculated operating cycle may be a cycle corresponding to the operating temperature code and/or the operating temperature.

In operation S130, the refresh control circuit 1200 may generate a base signal having a base cycle. The refresh control circuit 1200 may generate a refresh signal having the operating cycle by using the base signal.

In operation S140, the refresh control circuit 1200 may refresh the cell array 1100 every operating cycle, by using the refresh signal.

Figure 4:
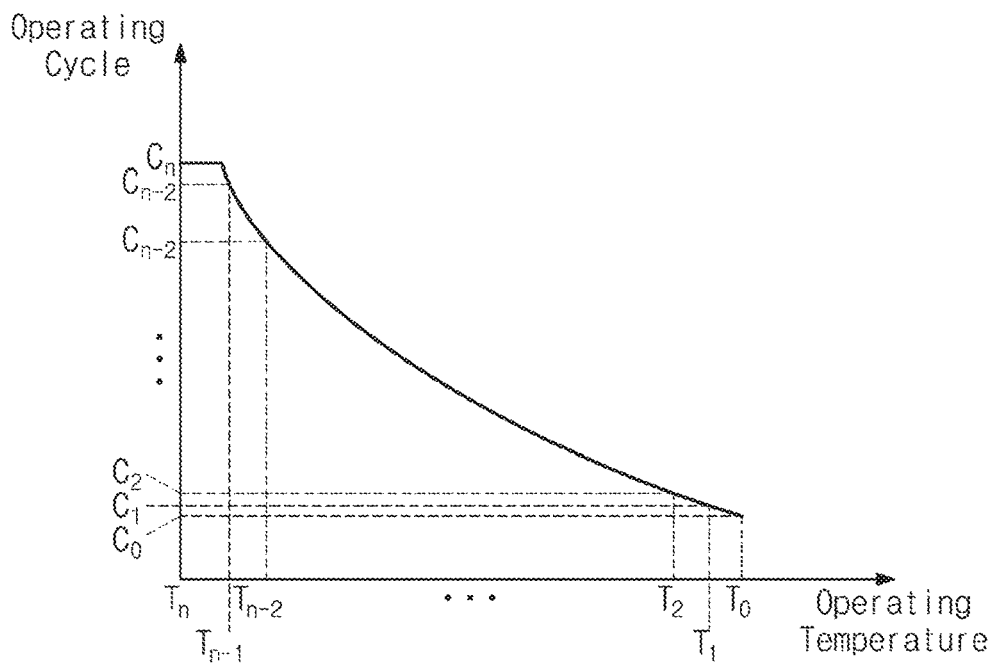
FIG. 4 is a graph for describing the case where a memory device stores data associated with operating cycles.

FIG. 4 is a graph for describing the case where a memory device 1000 stores data associated with operating cycles. In the graph of FIG. 4, a horizontal axis represents an operating temperature of the memory device 1000 of FIG. 1, and a vertical axis represents an operating cycle in which the memory device 1000 performs a refresh operation depending on an operating temperature.

A memory device may perform a refresh operation in an operating cycle that varies depending on an operating temperature. The graph of FIG. 4 indicates a correlation of an operating temperature and an operating cycle. However, the graph of FIG. 4 is an example graph, and the inventive concepts are not limited thereto. In some embodiments, the graph of FIG. 4 may have a gentler slope or may have a steeper slope. The graph of FIG. 4 indicates that the memory device performs refresh operations in operating cycles '$C_0$', '$C_1$', '$C_2$' ... '$C_{n-2}$', '$C_{n-1}$', and '$C_n$' at operating temperatures '$T_0$', '$T_1$', '$T_2$' ... '$T_{n-2}$', '$T_{n-1}$', and '$T_n$'. Here, "n" is a natural number of 2 or more.

The memory device may store temperature-cycle data. The memory device may perform the refresh operation in an operating cycle corresponding to an operating temperature, by using the temperature-cycle data. The temperature-cycle data means data for matching the temperatures $T_0$ to $T_n$ and the operating cycles $C_0$ to $C_n$. In detail, the temperature-cycle data may include temperature data indicating the temperatures $T_0$ to $T_n$, cycle data indicating the operating cycles $C_0$ to $C_n$, and matching data indicating a correspondence relationship between the temperatures $T_0$ to $T_n$ and the operating cycles $C_0$ to $C_n$.

In general, because information about 100 or more temperatures is stored in a refresh control circuit, "n" may be 100 or more. Referring to the graph of FIG. 4, an operating cycle decreases non-linearly as an operating temperature increases. That is, cycle data may express operating cycles of a wide range. Accordingly, in the case where "n" is 100, in general, cycle data are composed of 9 or more bits for the purpose of indicating an operating cycle. In this case, the sizes of cycle data and matching data that the memory device may store become relatively larger. That is, in the case where the temperature-cycle data are stored in the memory device, the memory device uses a storage capacity inefficiently.

Figure 5:
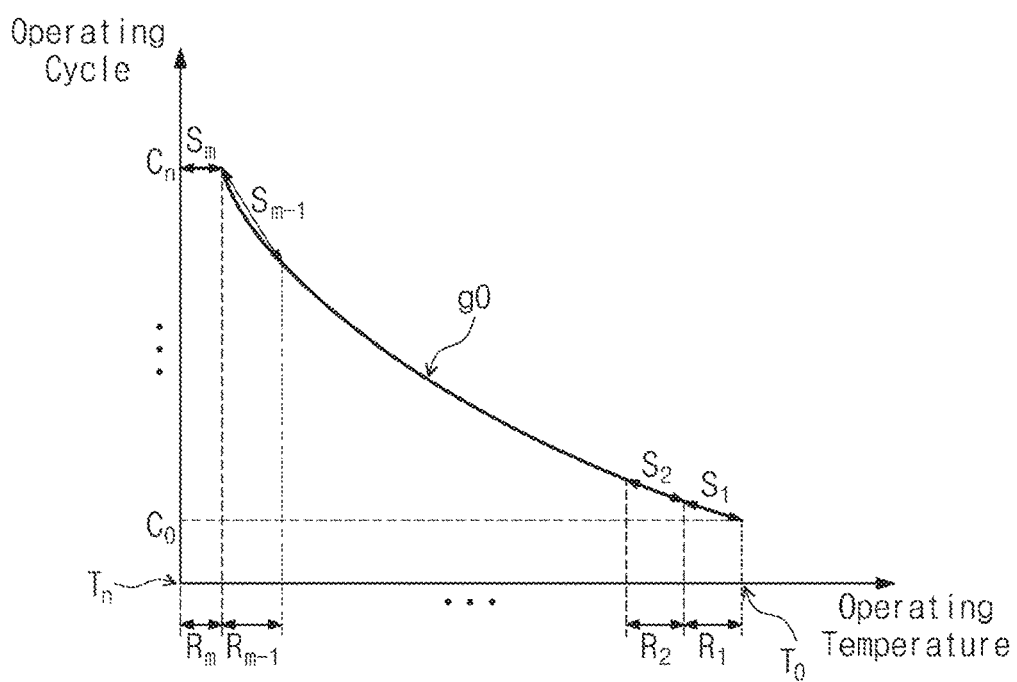
FIG. 5 is a graph for describing the case where a refresh control circuit of FIG. 2 stores data associated with slope values.

FIG. 5 is a graph for describing the case where a refresh control circuit 1200 of FIG. 2 stores data associated with slope values. In the graph of FIG. 5, a horizontal axis represents an operating temperature of the memory device 1000 of FIG. 1, and a vertical axis represents an operating cycle in which the memory device 1000 performs a refresh operation depending on an operating temperature.

As described with reference to FIG. 4, a graph g0 indicates the rate of change of an operating cycle relative to a change of an operating temperature. Also, as in the above description given with reference to FIG. 4, the refresh control circuit 1200 of FIG. 2 may perform the refresh operation in an operating cycle that varies depending on an operating temperature. However, unlike the memory device described with reference to FIG. 4, the refresh control circuit 1200 may store temperature-slope data.

The refresh control circuit 1200 may perform the refresh operation in an operating cycle by using the temperature-slope data. The temperature-slope data means data for matching temperatures and slope values. In detail, the refresh control circuit 1200 may calculate an operating cycle through an integration operation by using the temperature-slope data. In detail, the temperature-slope data may include temperature data, slope data, and matching data. The temperature data may indicate the temperatures $T_0$ to $T_n$. The slope data may indicate slope values $S_1$ to $S_m$. In some embodiments, slope values $S_1$ to $S_m$ may be slope values of the graph of the temperatures $T_1$ to $T_n$ at various points. For example, in some embodiments the slope values $S_1$ to $S_m$ may represent changes in the operating cycle with respect to changes in adjacent ones of the temperatures $T_1$ to $T_n$. Here, "m" may be a natural number that is 2 or more and is equal to or less than "n" of FIG. 4. The matching data may indicate a correspondence relationship between the temperatures $T_1$ to $T_n$ and the slope values $S_1$ to $S_m$ and a correspondence relationship between the temperature $T_0$ and the operating cycle $C_0$. The operating cycle $C_0$ corresponding to the highest temperature $T_0$ of the temperatures $T_0$ to $T_n$ may be an initial value of the integration operation. That is, the temperature $T_0$ may be matched to the operating cycle $C_0$, not a slope value.

Referring to the graph of FIG. 5, an operating temperature range $T_0$ to $T_n$ may be divided into "m" temperature ranges $R_1$ to $R_m$. The "operating temperature range $T_0$ to $T_n$" may refer to a temperature range in which the memory device 1000 is capable of operating. The slope values $S_1$ to $S_m$ may correspond to the temperature ranges $R_1$ to $R_m$, respectively. Each of the slope values $S_1$ to $S_m$ may be the rate of change of a cycle relative to a temperature change in each of the temperature ranges $R_1$ to $R_m$. Because "m" is less than "n", a plurality of temperatures may be included in at least one temperature range $R_k$ of the temperature ranges $R_1$ to $R_m$. Here, "k" may be a natural number that is 1 or more and is "m" or less. Temperatures included in the same temperature range may have the same slope value.

The temperature ranges $R_1$ to $R_m$ may include the temperatures $T_0$ to $T_n$. In the description below, it is assumed that the temperatures $T_0$ and $T_1$ are included in the temperature range $R_1$, the temperature $T_2$ is included in the temperature range $R_2$, the temperatures $T_{n-2}$ and $T_{n-1}$ are included in the temperature range $R_{m-1}$, and the temperature $T_n$ is included in the temperature range $R_m$. However, the inventive concepts are not limited thereto. For example, a relationship between temperatures and temperature ranges may vary depending on values of "m" and "n", a length of each of temperature range, and settings of a user. For example, whether a temperature $T_k$ placed at a left boundary of a temperature range $R_p$ is included in a temperature range $R_{p+1}$ or in a temperature range $R_p$ may be determined depending on the settings of the user. For another example, whether a temperature $T_k$ placed at a right boundary of the temperature range $R_p$ is included in a temperature range $R_{p-1}$ or in a temperature range $R_p$ may be determined depending on the settings of the user. Here, "p" may be a natural number that is more than 1 and is less than "m". For example, $R_p$ may be a temperature range between $R_0$ and $R_m$.

In the case where the temperature range $R_k$ corresponds to the slope value $S_k$, temperatures belonging to the temperature range $R_k$ may correspond to the slope value $S_k$. For example, the temperature $T_1$ belonging to the temperature range $R_1$ may correspond to the slope value $S_1$. The matching data indicate this correspondence relationship, which will be more fully described with reference to FIG. 6.

As illustrated in FIG. 5, the graph g0 may be a curve having a relatively gentle slope without a period in which a slope steeply changes, e.g., a peak. Because the variations of the slope values $S_1$ to $S_m$ are not great, slope data may express slope values by a relatively fewer number of bits. That is, slope data may be composed of bits, the number of which is less than the number of bits of cycle data described with reference to FIG. 4. In the case where "m" is 25, in general, slope data may be composed of 3 bits for the purpose of indicating a slope value. However, the inventive concepts are not limited thereto, and slope data may be composed of a plurality of bits.

That is, for example, in the case where "m" and "n" are respectively 25 and 100, slope data may include 75 (=3*25) bits for the purpose of storing slope values, and cycle data may include 900 (=9*100) bits for the purpose of storing operating cycle values.

Accordingly, in the case where the refresh control circuit 1200 stores the temperature-slope data, the amount of data to be stored in the refresh control circuit 1200 may be relatively small. In this case, the refresh control circuit 1200 may efficiently use a storage capacity, and the refresh control circuit 1200 may be implemented with a relatively small size.

The user may change a correspondence relationship between the temperatures $T_0$ to $T_n$ and the operating cycles $C_0$ to $C_n$ by changing slope data. That is, in the case where the user intends to change a correspondence relationship between the temperatures $T_0$ to $T_n$ and the operating cycles $C_0$ to $C_m$ the amount of data to be manipulated may be relatively small. Accordingly, the user may variously change a correspondence relationship between the temperatures $T_0$ to $T_n$ and the operating cycles $C_0$ to $C_n$ at a test stage and thus may find a correspondence relationship of minimizing and/or reducing the refresh current consumption more easily.

Figures 6, 7:
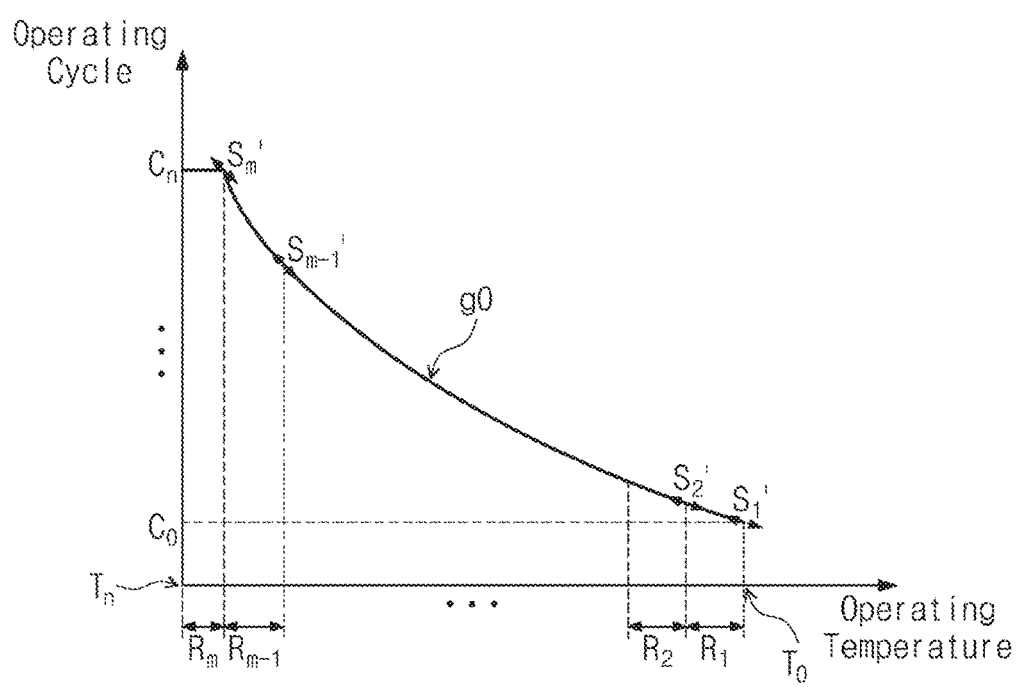
FIG. 6 is a table for describing matching data stored in a refresh control circuit of FIG. 2.
FIG. 7 is a graph for describing another embodiment of slope values of FIG. 5.

FIG. 6 is a table for describing matching data stored in a refresh control circuit 1200 of FIG. 2. FIGS. 4 and 5 will be referenced together to describe FIG. 6.

The matching data may indicate a correspondence relationship between the temperatures $T_1$ to $T_n$ and the slope values $S_1$ to $S_m$ and a correspondence relationship between the temperature $T_0$ and the operating cycle $C_0$. As described with reference to FIG. 5, in the case where the temperature range $R_k$ corresponds to the slope value $S_k$, temperatures belonging to the temperature range $R_k$ may correspond to the slope value $S_k$. However, the temperature $T_0$ may be matched to the operating cycle $C_0$.

In detail, the temperature $T_1$ may correspond to the slope value $S_1$, the temperature $T_2$ may correspond to the slope value $S_2$, the temperatures $T_{n-2}$ and $T_{n-1}$ may correspond to the slope value $S_{m-1}$, and the temperature $T_n$ may correspond to the slope value $S_m$. The temperature-slope data may indicate a correspondence relationship between the temperatures $T_1$ to $T_n$ and the slope values $S_1$ to $S_m$. Accordingly, the refresh control circuit 1200 may match an operating temperature to a slope value corresponding to the operating temperature by using the temperature-slope data.

FIG. 7 is a graph for describing another embodiment of slope values of FIG. 5. In the graph of FIG. 7, a horizontal axis represents an operating temperature of the memory device 1000 of FIG. 1, and a vertical axis represents an operating cycle in which the memory device 1000 performs a refresh operation depending on an operating temperature.

The description is given with reference to FIG. 5 as each of the slope values $S_1$ to $S_m$ is the rate of change of a cycle relative to a temperature change in each of the temperature ranges $R_1$ to $R_m$. In some embodiments, each of the slope values $S_1$ to $S_m$ may be the rate of change of an operating cycle of a refresh operation relative to a temperature change in each of the temperature ranges $R_1$ to $R_m$. However, the inventive concepts are not limited thereto. For example, each of the slope values $S_1$ to $S_m$ may be a value associated with the rate of change of a cycle relative to a temperature change in each of the temperature ranges $R_1$ to $R_m$. For example, as illustrated in FIG. 7, each of slope values $S_1'$ to $S_m'$ may be a slope of a tangent at a right boundary of each of the temperature ranges $R_1$ to $R_m$. Also, although not illustrated in FIG. 7, each of slope values $S_1'$ to $S_m'$ may be a slope of a tangent at a left boundary of each of the temperature ranges $R_1$ to $R_m$.

Figure 8:
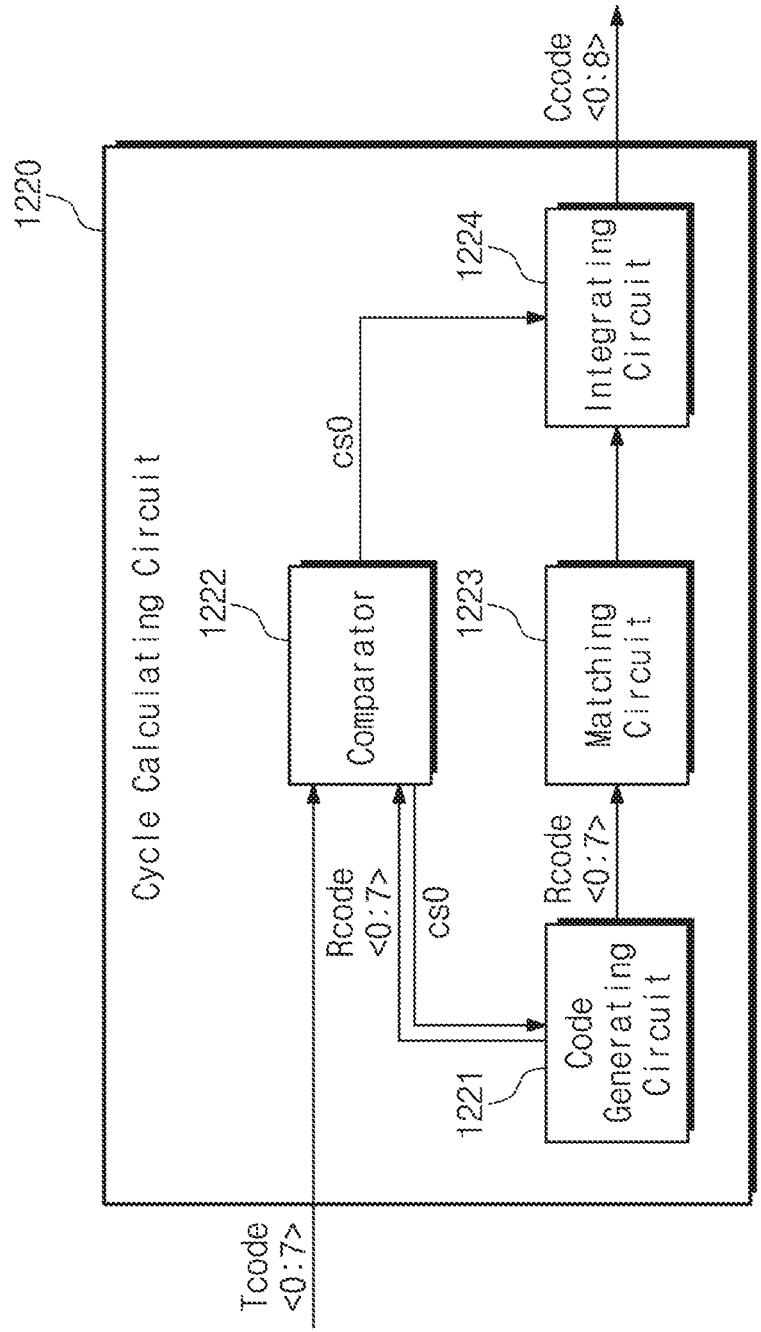
FIG. 8 is a block diagram for describing an operation of a cycle calculating circuit of FIG. 2.

FIG. 8 is a block diagram for describing an operation of a cycle calculating circuit 1220 of FIG. 2.

The cycle calculating circuit 1220 may include a code generating circuit 1221, a comparator 1222, a matching circuit 1223, and an integrating circuit 1224.

The code generating circuit 1221 may generate reference temperature code Rcode<0:7>. The reference temperature code Rcode<0:7> may indicate a reference temperature. Below, it is assumed that the reference temperature code Rcode<0:7> is composed of 8 bits. However, the inventive concepts are not limited thereto. For example, the reference temperature code Rcode<0:7> may be composed of one or more bits.

The reference temperature code Rcode<0:7> may be a logic value between "00000000" and "11111111". As a logic value of the reference temperature code Rcode<0:7> increases, the reference temperature code Rcode<0:7> may indicate a lower reference temperature.

For example, in the case where the memory device 1000 of FIG. 2 operates between the temperature $T_0$ of FIG. 4 and the temperature $T_n$ of FIG. 4, the reference temperature code Rcode<0:7> of "00000000" may indicate the temperature $T_0$, and the reference temperature code Rcode<0:7> of "00000001" may indicate the temperature $T_1$. Also, the reference temperature code Rcode<0:7> of "11111111" may indicate the temperature $T_n$. However, the inventive concepts are not limited thereto. For example, the rate of change of a temperature relative to a change of the reference temperature code Rcode<0:7> may vary depending on the number of temperatures $T_0$ to $T_n$ of FIG. 4, a magnitude of a unit temperature, or the number of bits of the reference temperature code Rcode<0:7>.

The code generating circuit 1221 may output the reference temperature code Rcode<0:7> to the comparator 1222. The comparator 1222 may compare the operating temperature code Tcode<0:7> and the reference temperature code Rcode<0:7>. When the operating temperature code Tcode<0:7> is not matched to the reference temperature code Rcode<0:7>, the comparator 1222 may output a control signal cs0 having a first logic value to the code generating circuit 1221. When the operating temperature code Tcode<0:7> is matched to the reference temperature code Rcode<0:7>, the comparator 1222 may output the control signal cs0 having a second logic value to the code generating circuit 1221.

That the operating temperature code Tcode<0:7> is not matched to the reference temperature code Rcode<0:7> means that an operating temperature is not matched to a reference temperature. That the operating temperature code Tcode<0:7> is matched to the reference temperature code Rcode<0:7> means that an operating temperature is matched to a reference temperature.

In the descriptions below, it is assumed that the control signal cs0 selectively has the first logic value or the second logic value. When the first logic value is "0," the second logic value may mean "1"; when the first logic value is "1", the second logic value may mean "0". However, the inventive concepts are not limited thereto. For example, the first logic value and the second logic value may mean a first voltage level and a second voltage level, respectively.

In the case where the control signal cs0 having the first logic value is received, the code generating circuit 1221 may increase the previously output reference temperature code Rcode<0:7> by as much as "1". As used herein, increasing a value by as much as "1" may include incrementing the value in a manner consistent with the data format of the value. That is, whenever the control signal cs0 of the first logic value is received, the code generating circuit 1221 may increase the previously output reference temperature code Rcode<0:7> by as much as "1".

In the case where the control signal cs0 having the second logic value is received, the code generating circuit 1221 may be reset. That the code generating circuit 1221 is reset means that the code generating circuit 1221 again generates the reference temperature code Rcode<0:7> having a logic value of "00000000".

When the operating temperature code Tcode<0:7> is received from the temperature sensing circuit 1210 of FIG. 2 after the code generating circuit 1221 is reset, the code generating circuit 1221 may again generate the reference temperature code Rcode<0:7> having a logic value of "00000000". In detail, the operating temperature code Tcode<0:7> may be output from the temperature sensing circuit 1210 every first cycle, and the code generating circuit 1221 may generate the reference temperature code Rcode<0:7> while increasing a logic value every second cycle. Because the second cycle is smaller than the first cycle, the code generating circuit 1221 may generate the reference temperature code Rcode<0:7> several times until the reference temperature code Rcode<0:7> is matched to the operating temperature code Tcode<0:7>.

The code generating circuit 1221 may output the reference temperature code Rcode<0:7> to the matching circuit 1223. The matching circuit 1223 may store the temperature-slope data described with reference to FIGS. 5 and 6. The matching circuit 1223 may match a reference temperature to a slope value corresponding to the reference temperature, based on the temperature-slope data and the reference temperature code Rcode<0:7>. The matching circuit 1223 may output the slope value corresponding to the reference temperature to the integrating circuit 1224. For example, in the case where the reference temperature code Rcode<0:7> of "00000001" is received, the matching circuit 1223 may output the slope value $S_1$ corresponding to the reference temperature $T_1$. However, in the case where the reference temperature code Rcode<0:7> of "00000000" is received, the matching circuit 1223 may output the operating cycle $C_0$. The operating cycle $C_0$ may be an initial value of an integration operation that is performed at the integrating circuit 1224.

The code generating circuit 1221 may sequentially output reference temperature codes while increasing the reference temperature code Rcode<0:7> by as much as "1", until the reference temperature code Rcode<0:7> is matched to the operating temperature code Tcode<0:7>. Accordingly, the matching circuit 1223 may sequentially output slope values corresponding to the reference temperature codes until the reference temperature code Rcode<0:7> is matched to the operating temperature code Tcode<0:7>.

The integrating circuit 1224 may sequentially integrate the received slope values. The integrating circuit 1224 may integrate the slope values to calculate an operating cycle. That is, the integrating circuit 1224 may calculate an operating cycle by performing the integration operation until the reference temperature code Rcode<0:7> is matched to the operating temperature code Tcode<0:7>.

For example, the case where an operating temperature is $T_k$ will be described. It is assumed that "k" is an integer being 1 or more and "n" or less. For example, the operating temperature $T_k$ may refer to a selected temperature between the maximum temperature $T_0$ and a minimum temperature $T_n$. In the case where the reference temperature code Rcode<0:7> of "00000000" is received, the matching circuit 1223 may output the operating cycle $C_0$. The matching circuit 1223 may receive the reference temperature code Rcode<0:7> of "00000000" and then may receive the reference temperature code Rcode<0:7> of "00000001". In the case where the reference temperature code Rcode<0:7> of "00000001" is received, the matching circuit 1223 may output the slope value $S_1$. The integrating circuit 1224 may add the slope value $S_1$ to the temperature $T_0$. The integrating circuit 1224 may store the calculated result $(T_0+S_1)$. The matching circuit 1223 may sequentially output the slope values until the reference temperature code Rcode<0:7> indicating the temperature $T_k$ is received. The integrating circuit 1224 may sequentially add the received slope values to the result $(T_0+S_1)$ of a previous integration operation. Accordingly, the integrating circuit 1224 may obtain the final result $(T_0+S_1+S_2 \ldots S_{k-1}+S_k)$ of the integration operation. The integration operation result $(T_0+S_1+S_2 \ldots S_{k-1}+S_k)$ may be an operating cycle corresponding to the temperature $T_k$.

As described above, the comparator 1222 may output the control signal cs0 having a logic value that varies depending on whether the operating temperature code Tcode<0:7> is matched to the reference temperature code Rcode<0:7>. When the operating temperature code Tcode<0:7> is not matched to the reference temperature code Rcode<0:7>, the comparator 1222 may output the control signal cs0 having the first logic value to the integrating circuit 1224. In this case, the integrating circuit 1224 may continue to perform the integration operation. When the operating temperature code Tcode<0:7> is matched to the reference temperature code Rcode<0:7>, the comparator 1222 may output the control signal cs0 having the second logic value to the integrating circuit 1224. In this case, the integrating circuit 1224 may transform the result of the integration operation into the operating cycle code Ccode<0:8>. The operating cycle code Ccode<0:8> may indicate an operating cycle. The operating cycle code Ccode<0:8> may be a code in which 9 bits are listed.

After outputting the operating cycle code Ccode<0:8>, the integrating circuit 1224 may be reset by the control signal cs0 having the second logic value. When the integrating circuit 1224 is reset, an integration operation value stored therein may be reset to 0.

Figure 9:
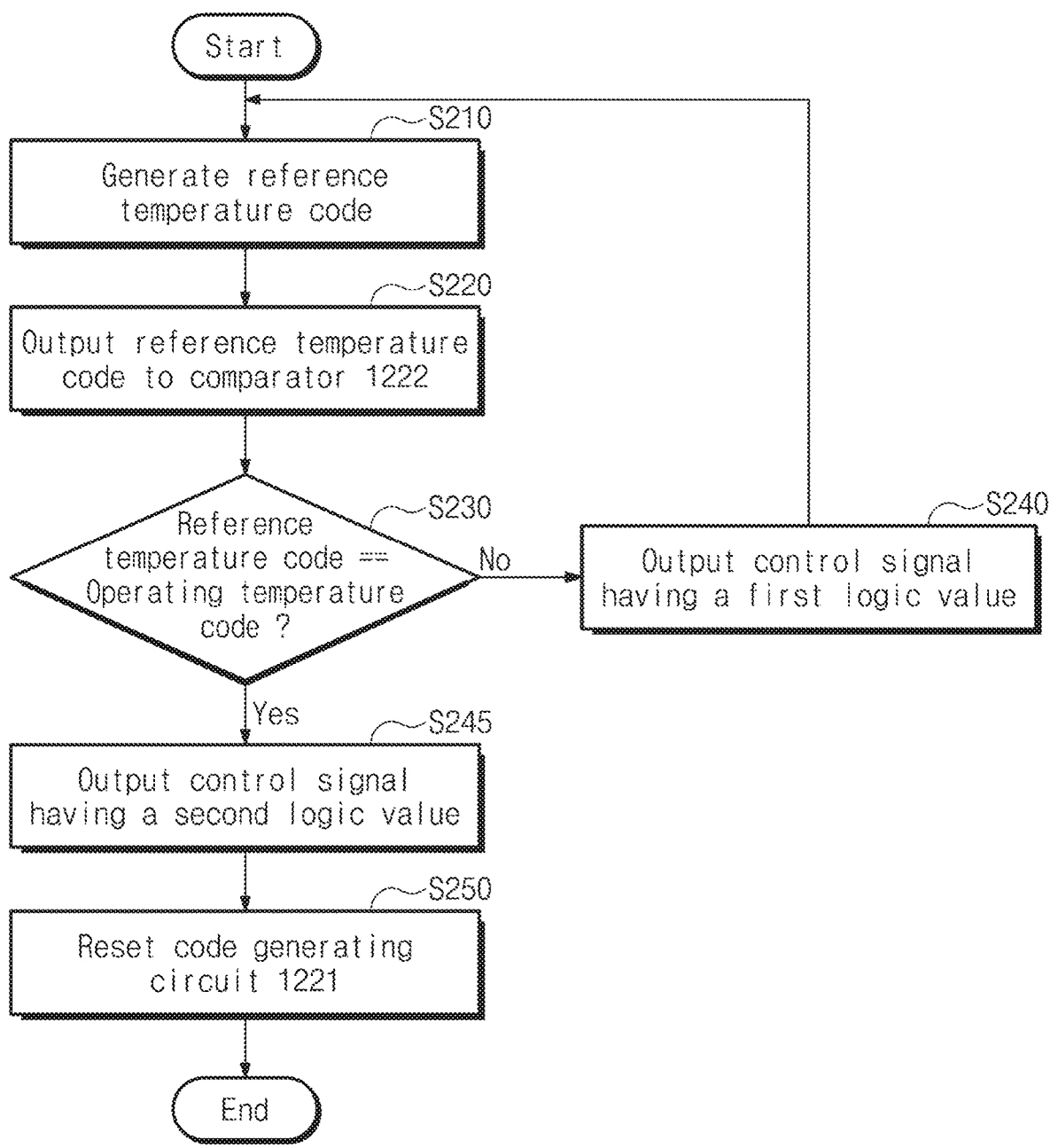
FIG. 9 is a flowchart for describing an operation of a code generating circuit and a comparator of FIG. 8.

FIG. 9 is a flowchart for describing an operation of a code generating circuit 1221 and a comparator 1222 of FIG. 8.

When the operating temperature code Tcode<0:7> is "00000000", the code generating circuit 1221 may generate the reference temperature code Rcode<0:7> of "00000000" and then may be reset. Operations that are performed after the code generating circuit 1221 of FIG. 8 generates the reference temperature code Rcode<0:7> of "00000000" will be described with reference to FIG. 9. Also, it is assumed that a logic value of the operating temperature code Tcode<0:7> is greater than "00000000".

In operation S210, the code generating circuit 1221 may generate the reference temperature code Rcode<0:7>.

In operation S220, the code generating circuit 1221 may output the generated reference temperature code Rcode<0:7> to the comparator 1222.

In operation S230, the comparator 1222 may compare the operating temperature code Tcode<0:7> and the reference temperature code Rcode<0:7>.

When the reference temperature code Rcode<0:7> is not matched to the operating temperature code Tcode<0:7>, operation S240 may be performed. In operation S240, the comparator 1222 may output the control signal cs0 having the first logic value. When the control signal cs0 having the first logic value is received, the code generating circuit 1221 may generate a new reference temperature code Rcode<0:7>. That is, after operation S240 is performed, operation S210 to operation S230 may be again performed. In operation S210, the code generating circuit 1221 may generate the new reference temperature code Rcode<0:7> that is greater than the previously generated reference temperature code Rcode<0:7> by as much as "1".

When the reference temperature code Rcode<0:7> is matched to the operating temperature code Tcode<0:7>, operation S245 may be performed. In operation S245, the comparator 1222 may output the control signal cs0 having the second logic value. When the control signal cs0 having the second logic value is received, in operation S250, the code generating circuit 1221 may be reset. After the code generating circuit 1221 is reset, the code generating circuit 1221 may again generate the reference temperature code Rcode<0:7> of "00000000".

Figure 10:
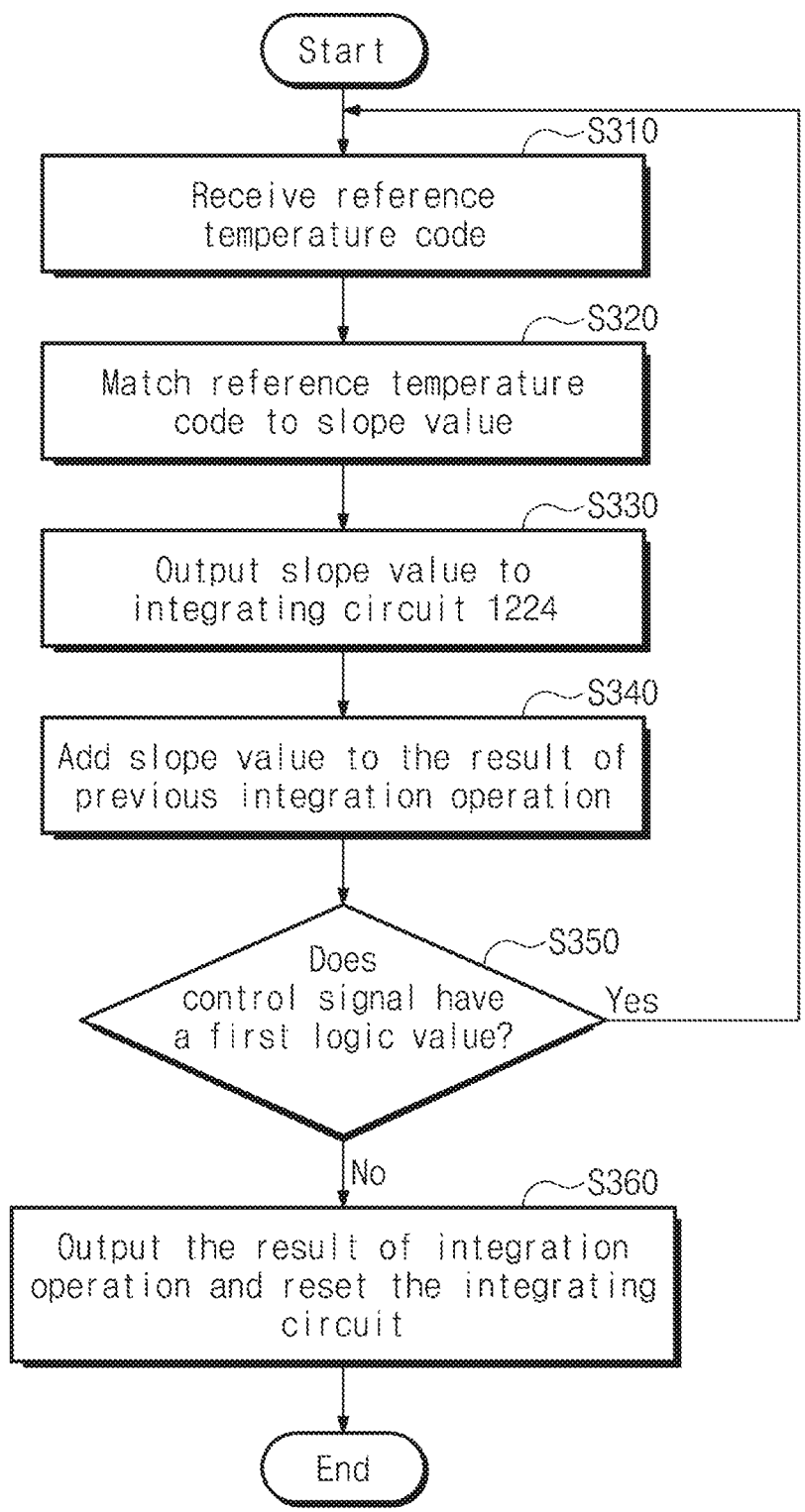
FIG. 10 is a flowchart for describing an operation of a matching circuit and an integrating circuit of FIG. 8.

FIG. 10 is a flowchart for describing an operation of a matching circuit 1223 and an integrating circuit 1224 of FIG. 8.

When the operating temperature code Tcode<0:7> is "00000000", the integrating circuit 1224 of FIG. 8 may be reset immediately after outputting the operating cycle code Ccode<0:8> corresponding to the operating cycle $C_0$. Operations that are performed after the matching circuit 1223 of FIG. 8 generates the operating cycle $C_0$ corresponding to the reference temperature code Rcode<0:7> of "00000000" will be described with reference to FIG. 10. Like the description given with reference to FIG. 9, it is assumed that the operating temperature code Tcode<0:7> is greater than "00000000".

In operation S310, the matching circuit 1223 may receive the reference temperature code Rcode<0:7> from the code generating circuit 1221.

In operation S320, the matching circuit 1223 may match the reference temperature code Rcode<0:7> to a slope value.

In operation S330, the matching circuit 1223 may output the slope value matched to the reference temperature code Rcode<0:7> to the integrating circuit 1224.

In operation S340, the integrating circuit 1224 may add the slope value to a result of a previous integration operation. For example, when the reference temperature code Rcode<0:7> is "00000010", the result of the previous integration operation may be "$C_0+S_1$".

In operation S350, the integrating circuit 1224 may receive the control signal cs0 from the comparator 1222.

When the control signal cs0 having the first logic value is received at the integrating circuit 1224, operation S310 to operation S350 may be again performed. In this case, the reference temperature code Rcode<0:7> received to the matching circuit 1223 in operation S310 may be greater than the previously received reference temperature code Rcode<0:7> by as much as "1".

When the control signal cs0 having the second logic value is received at the integrating circuit 1224, operation S360 may be performed. In operation S360, the integrating circuit 1224 may transform the result of the integration operation into the operating cycle code Ccode<0:8> and may output the operating cycle code Ccode<0:8>. The integrating circuit 1224 may be reset after outputting the operating cycle code Ccode<0:8>. When the integrating circuit 1224 is reset, a result of an integration operation stored in the integrating circuit 1224 may be reset to 0.

Figure 11:
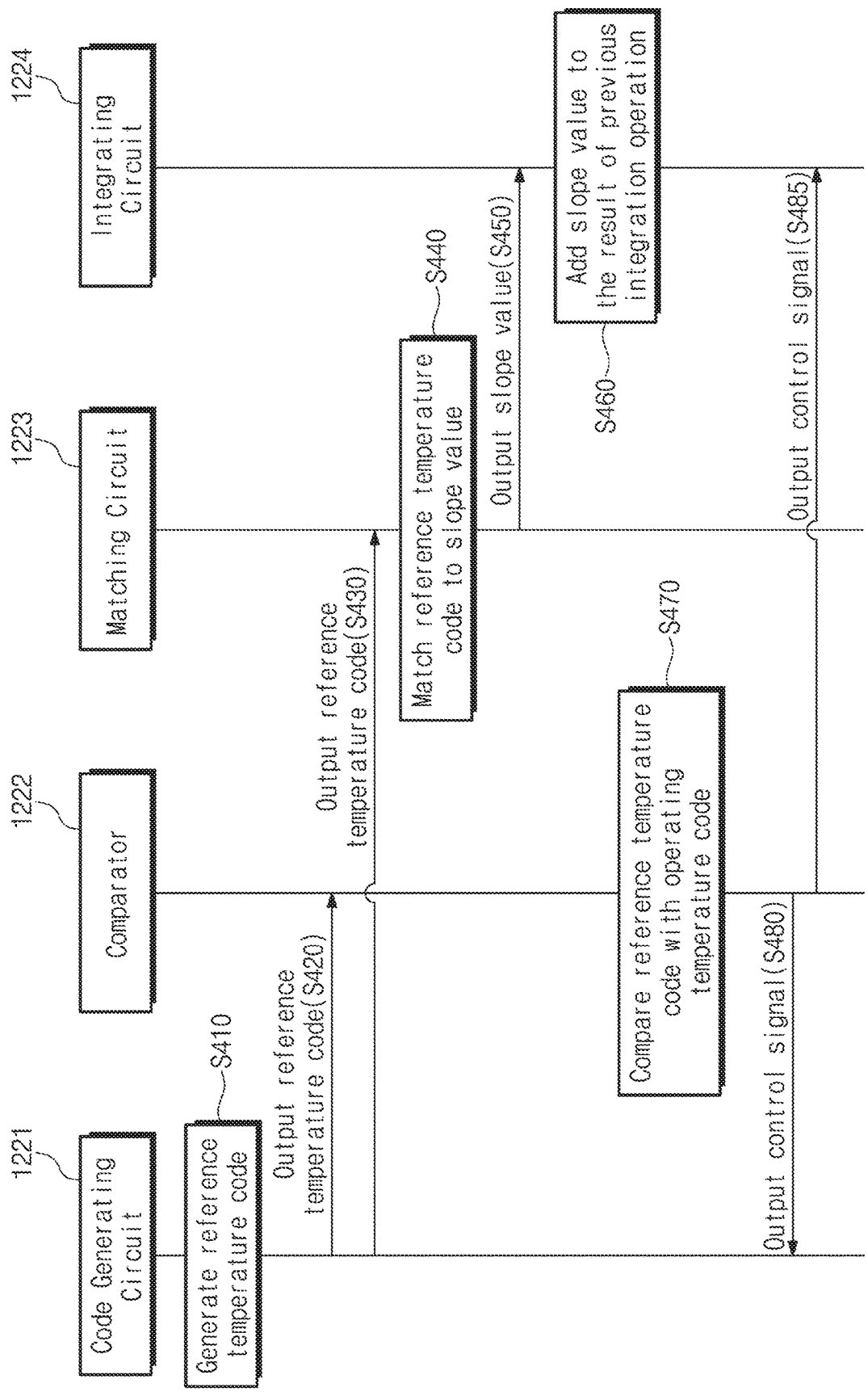
FIG. 11 is a flowchart illustrating an interaction between components of a cycle calculating circuit of FIG. 8.

FIG. 11 is a flowchart illustrating an interaction between components of a cycle calculating circuit of FIG. 8.

Operations that are performed after the code generating circuit 1221 generates the reference temperature code Rcode<0:7> of "00000000" will be described with reference to FIG. 11. Also, it is assumed that the operating temperature code Tcode<0:7> is greater than "00000000".

In operation S410, the code generating circuit 1221 may generate the reference temperature code Rcode<0:7>.

In operation S420 and operation S430, the code generating circuit 1221 may output the reference temperature code Rcode<0:7> to the comparator 1222 and the matching circuit 1223.

In operation S440, the matching circuit 1223 may match the reference temperature code Rcode<0:7> to a slope value.

In operation S450, the matching circuit 1223 may output the matched slope value to the integrating circuit 1224.

In operation S460, the integrating circuit 1224 may add the received slope values to a result of a previous integration operation.

In operation S470, the comparator 1222 may compare the reference temperature code Rcode<0:7> received in operation S420 and the operating temperature code Tcode<0:7>.

In operation S480 and operation S485, the comparator 1222 may output the control signal cs0 to the code generating circuit 1221 and the integrating circuit 1224 depending on a result of the comparison. Depending on the logic value of the control signal cs0, the components 1221, 1222, 1223, and 1224 of the cycle calculating circuit 1220 of FIG. 8 may provide different operations. In detail, in the case where the control signal cs0 of the first logic value is output, the components 1221, 1222, 1223, and 1224 of the cycle calculating circuit 1220 may repeatedly perform operation S410 to operation S485 until the control signal cs0 of the second logic value is output. In the case where the control signal cs0 of the second logic value is output, the components 1221, 1222, 1223, and 1224 of the cycle calculating circuit 1220 may be reset.

Figure 12:
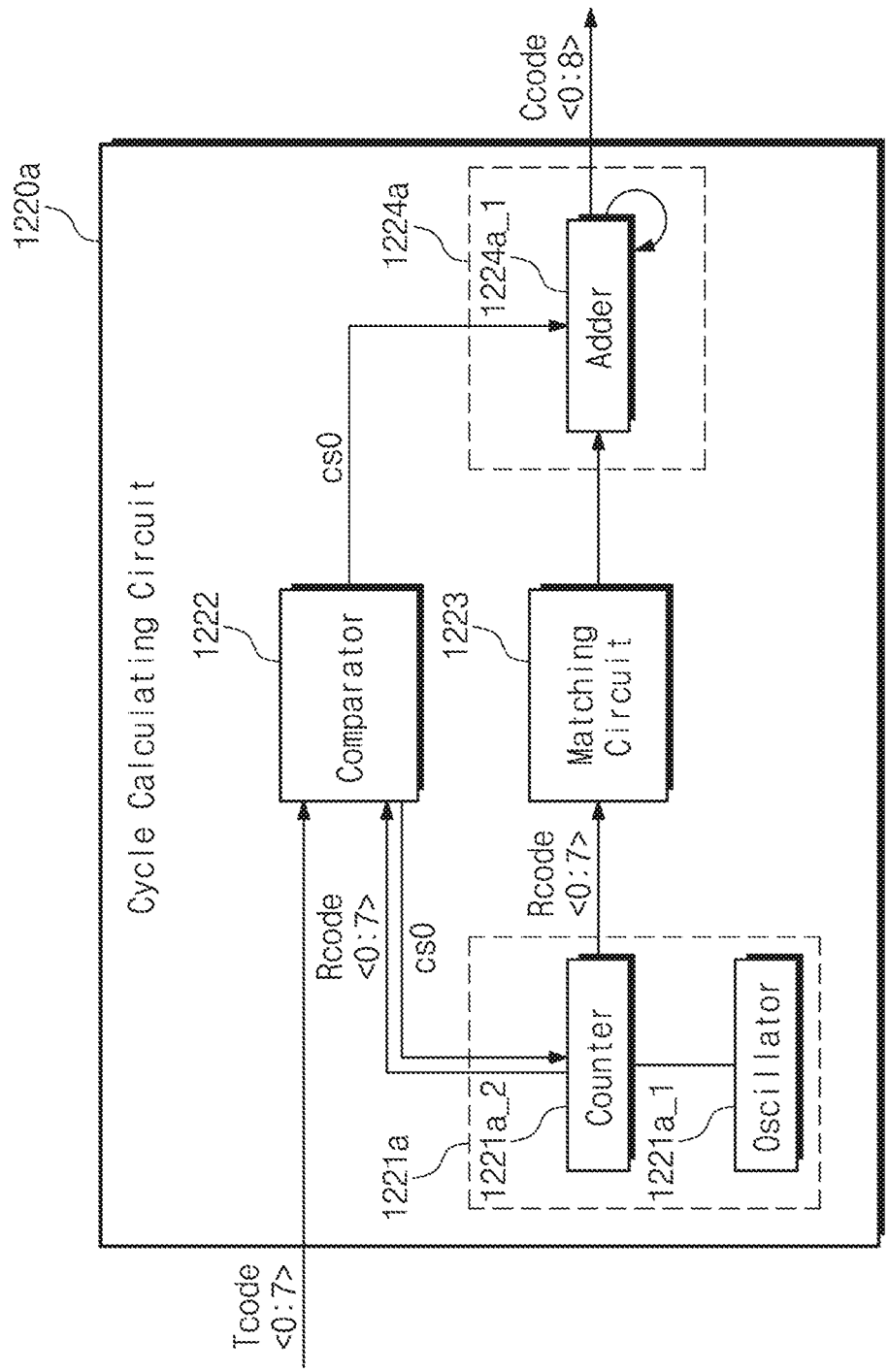
FIG. 12 is a block diagram illustrating an example configuration of a cycle calculating circuit of FIG. 8.

FIG. 12 is a block diagram illustrating an example configuration of a cycle calculating circuit 1220a of FIG. 8.

Components 1221a, 1222, 1223, and 1224a of a cycle calculating circuit 1220a may provide substantially the same operations as the components 1221, 1222, 1223, and 1224 of the cycle calculating circuit 1220 of FIG. 8. Thus, the configurations of the code generating circuit 1221a and the integrating circuit 1224a in FIG. 12 are described in detail, and additional description will be omitted to avoid redundancy.

The code generating circuit 1221a may include an oscillator 1221a_1 and a counter 1221a_2. The oscillator 1221a_1 may generate an AC signal. A cycle of the AC signal may be shorter than a cycle in which the temperature sensing circuit 1210 of FIG. 2 senses an operating temperature.

The counter 1221a_2 may receive the AC signal from the oscillator 1221a_1. The counter 1221a_2 may generate the reference temperature code Rcode<0:7>, based on the AC signal. The counter 1221a_2 may be an asynchronous counter. In the case where a reference temperature code is composed of "n" bits, the counter 1221a_2 may include "n" flip-flops. That is, in this description, the counter 1221a_2 may include 8 flip-flops. For example, flip-flops may be T flip-flops, D flip-flops, or JK flip-flops. Whenever a pulse of the AC signal is input, the counter 1221a_2 may increase a logic value of the reference temperature code Rcode<0:7> by as much as "1". In the case where the counter 1221a_2 is reset by the control signal cs0, when a pulse of the AC signal is input, the counter 1221a_2 may again increase a logic value of the reference temperature code Rcode<0:7> from "00000000".

The integrating circuit 1224a may include an adder 1224a_1. The adder 1224a_1 may perform an addition operation and may store a result of the addition operation. The addition operation and the result of the addition operation may generate the integration operation and the result of the integration operation described above. The adder 1224a_1 may receive a slope value from the matching circuit 1223. The adder 1224a_1 may add the slope value to the stored result of the addition operation. The adder 1224a_1 may repeat the above operation until the control signal cs0 of the second logic value is received. In the case where the control signal cs0 of the second logic value is received, the adder 1224a_1 may transform the result of the addition operation into the operating cycle code Ccode<0:8> and may output the operating cycle code Ccode<0:8>.

Figure 13:
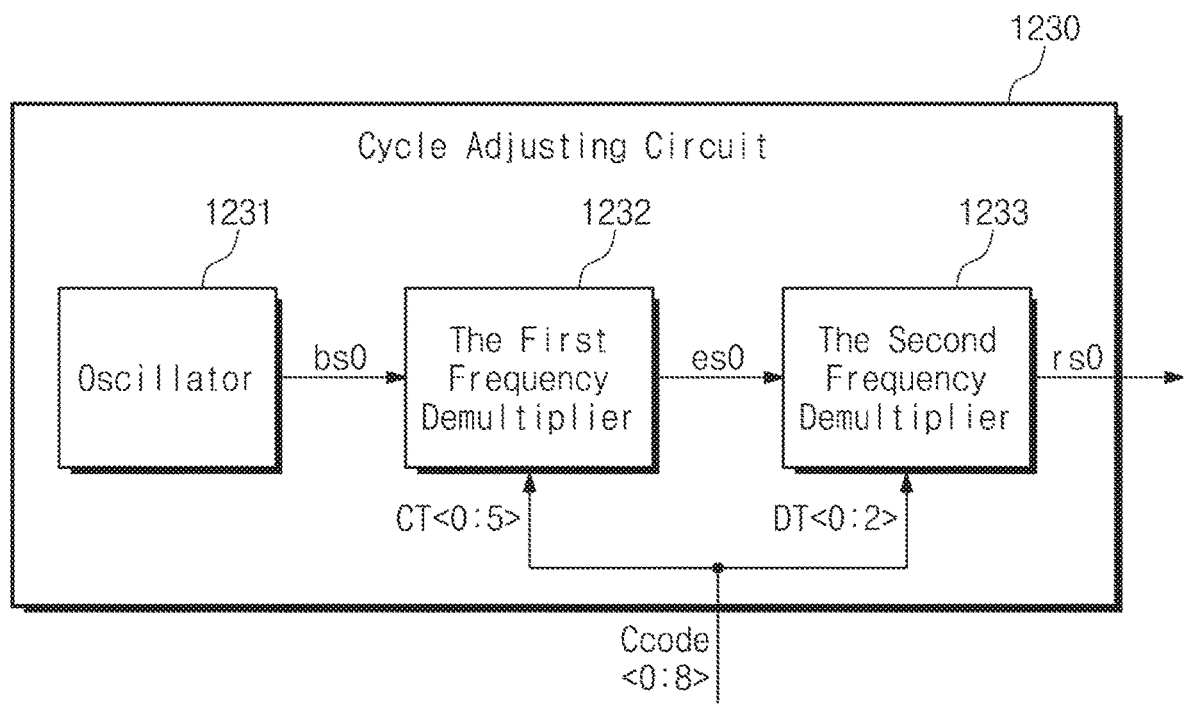
FIG. 13 is a block diagram for describing an operation of a cycle adjusting circuit of FIG. 2.

FIG. 13 is a block diagram for describing an operation of a cycle adjusting circuit 1230 of FIG. 2.

The cycle adjusting circuit 1230 may include an oscillator 1231, a first frequency demultiplier 1232, and a second frequency demultiplier 1233. The cycle adjusting circuit 1230 may receive the operating cycle code Ccode<0:8> from the cycle calculating circuit 1220 of FIG. 2. The cycle adjusting circuit 1230 may output the refresh signal rs0, based on a base signal bs0 generated from the oscillator 1231 and the operating cycle code Ccode<0:8>. The refresh control circuit 1200 of FIG. 2 may refresh the cell array 1100 of FIG. 2 by using the refresh signal rs0.

The oscillator 1231 may generate the base signal bs0 having a base cycle. The base signal bs0 may be an AC signal having the base cycle. The oscillator 1231 may output the base signal bs0 to the first frequency demultiplier 1232. In some embodiments, the oscillator 1231 may be identical to the oscillator 1221a_1 of FIG. 12.

The first frequency demultiplier 1232 may receive the base signal bs0.

The first frequency demultiplier 1232 may also receive a lower bit code CT<0:5>. In the descriptions below, the "lower bit code CT<0:5>" may refer a code that includes the lower 6 bits of the operating cycle code Ccode<0:8>. Also, an "upper bit code DT<0:2>" may refer to a signal that includes the upper 3 bits of the operating cycle code Ccode<0:8>. However, the inventive concepts are not limited thereto. For example, the lower bit code CT<0:5> may be a code that includes some bits of the operating cycle code Ccode<0:8>, and the upper bit code DT<0:2> may be a code that includes the remaining bits of the operating cycle code Ccode<0:8>.

The first frequency demultiplier 1232 may generate an extension signal es0, based on the lower bit code CT<0:5> and the base signal bs0. A cycle of the extension signal es0 may be longer than a cycle of the base signal bs0. In the description herein, a cycle of the extension signal es0 is expressed as an "extension cycle," and a cycle of the base signal bs0 is expressed as a "base cycle."

The first frequency demultiplier 1232 may output the extension signal es0 to the second frequency demultiplier 1233.

The second frequency demultiplier 1233 may generate the refresh signal rs0, based on the upper bit code DT<0:2> and the extension signal es0. A cycle of the refresh signal rs0 may be equal to a cycle of the extension signal es0 or may be longer than the cycle of the extension signal es0. The cycle of the refresh signal rs0 may be an operating cycle that the operating cycle code Ccode<0:8> indicates. In the descriptions below, a cycle of the refresh signal rs0 is expressed as an "operating cycle."

Figure 14:
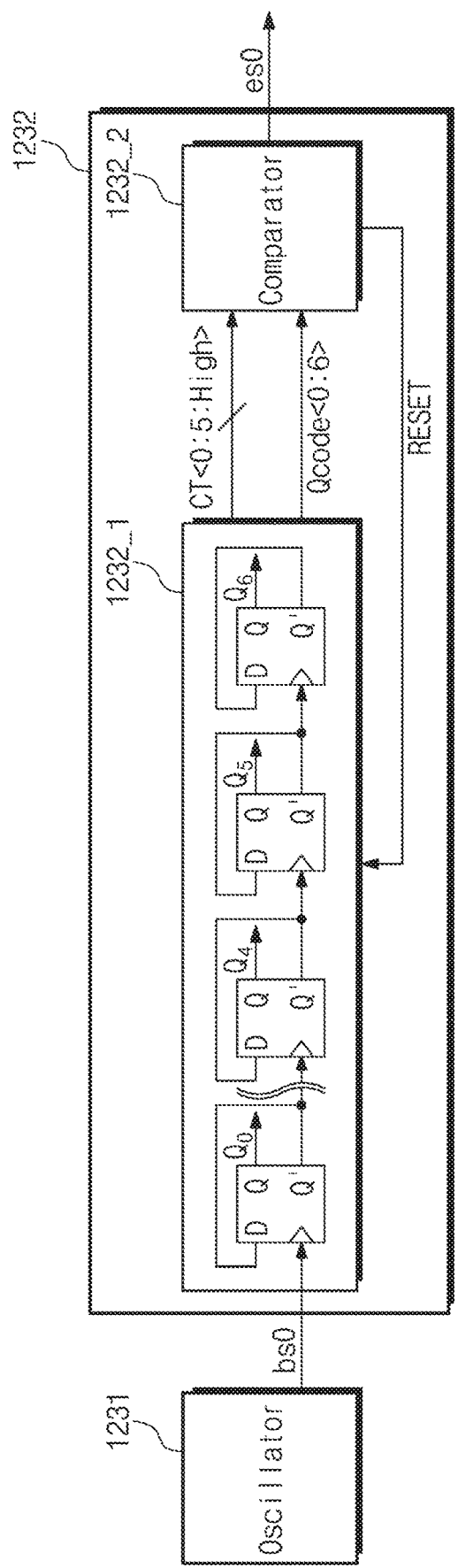
FIG. 14 is a block diagram for describing an operation of a first frequency demultiplier of FIG. 13.

FIG. 14 is a block diagram for describing an operation of a first frequency demultiplier 1232 of FIG. 13.

The first frequency demultiplier 1232 may include a first counter 1232_1 and a comparator 1232_2.

The first counter 1232_1 may include flip-flops. The number of flip-flops may be more than the number of bits of the lower bit code CT<0:5> by as much as "1". That is, the first counter 1232_1 may include 7 flip-flops. For example, flip-flops may be T flip-flops, D flip-flops, and/or JK flip-flops. In the descriptions below, it is assumed that the first counter 1232_1 includes D flip-flops, but the inventive concepts are not limited thereto.

The first counter 1232_1 may be an asynchronous counter. The first flip-flop of the serially connected flip-flops may receive the base signal bs0, e.g., through a clock terminal). Each of the remaining flip-flops of the flip-flops other than the first flip-flop may receive a signal, which is output from a Q' terminal of a different flip-flop placed on the left thereof (in FIG. 14), e.g., through a clock terminal. Also, each of the flip-flops may receive a signal output from a Q' terminal through a D terminal.

According to the above configuration, a cycle of a signal $Q_n$ output from a Q terminal of an n-th flip-flop may be $2^n$ times the base cycle. In the descriptions below, the "n-th flip-flop" means a flip-flop, which is placed at an n-th position with respect to the leftmost flip-flop (e.g., a first flip-flip), from among the flip-flops.

The first counter 1232_1 may output a first count code Qcode<0:6>. The first count code Qcode<0:6> may be composed of 7 bits. The bits of the first count code Qcode<0:6> may indicate logic values of signals $Q_0$ to $Q_6$ in order from the right. Whenever a pulse of the base signal bs0 is input, the first counter 1232_1 may increase a logic value of the first count code Qcode<0:6> by as much as "1". That is, whenever a pulse of the base signal bs0 is input, a logic value of the first count code Qcode<0:6> may increase from "0000000" by as much as "1". In the descriptions below, it is assumed that the first counter 1232_1 increases a logic value of the first count code Qcode<0:6> by as much as "1" every rising edge of the pulse. However, the inventive concepts are not limited thereto. For example, the first counter 1232_1 may increase a logic value of the first count code Qcode<0:6> by as much as "1" every falling edge of the pulse.

The first frequency demultiplier 1232 may transform the lower bit code CT<0:5> into a lower bit code CT<0:5:High>. The lower bit code CT<0:5:High> may be a code that is generated by adding a bit having a logic value "1" to the leftmost bit position of the lower bit code CT<0:5>.

The comparator 1232_2 may compare the first count code Qcode<0:6> and the transformed lower bit code CT<0:5:High>. As described above, because a logic value of the first count code Qcode<0:6> increases by as much as "1" whenever a pulse of the base signal bs0 is input, a logic value of the first count code Qcode<0:6> input to the comparator 1232_2 may increase by as much as "1" every base cycle. The comparator 1232_2 may repeatedly perform the comparison operation until a logic value of the lower bit code CT<0:5:High> is matched to a logic value of the first count code Qcode<0:6>.

When the lower bit code CT<0:5:High> is matched to the first count code Qcode<0:6>, the comparator 1232_2 may output the extension signal es0.

Also, when the lower bit code CT<0:5:High> is matched to the first count code Qcode<0:6>, the comparator 1232_2 may reset the first counter 1232_1. When the first counter 1232_1 is reset, the first counter 1232_1 may increase a logic value of the first count code Qcode<0:6> from "0000000" by as much as "1". The comparator 1232_2 may again perform the comparison operation. When the lower bit code CT<0:5:High> is matched to the first count code Qcode<0:6>, the comparator 1232_2 may again output the extension signal es0. That is, the extension signal es0 may be output every given cycle. In the descriptions herein, a cycle of the extension signal es0 is expressed as an "extension cycle."

Figure 15:
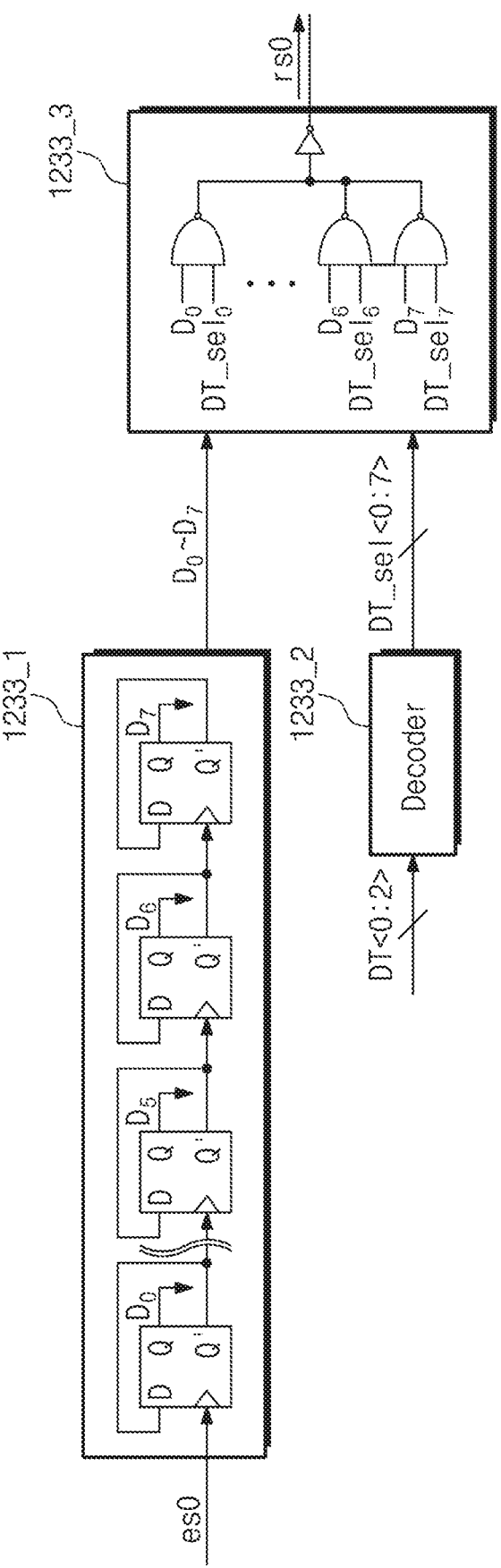
FIG. 15 is a block diagram for describing an operation of a second frequency demultiplier of FIG. 13.

FIG. 15 is a block diagram for describing an operation of a second frequency demultiplier 1233 of FIG. 13.

The second frequency demultiplier 1233 may include a second counter 1233_1, a decoder 1233_2, and a selection circuit 1233_3.

The second counter 1233_1 may include flip-flops. In the case where the number of bits of the upper bit code DT<0:2> is "n," the number of flip-flops may be $2^n$. In this description, because the number of bits of the upper bit code DT<0:2> is 3, the second counter 1233_1 may include 8 flip-flops. For example, the flip-flops may be T flip-flops, D flip-flops, and/or JK flip-flops. In the descriptions below, it is assumed that the second counter 1233_1 includes D flip-flops, but the inventive concepts are not limited thereto.

The second counter 1233_1 may be an asynchronous counter. The first flip-flop of the serially connected flip-flops may receive the extension signal es0 through a clock terminal. Each of the remaining flip-flops of the flip-flops other than the first flip-flop may receive a signal, which is output from a Q' terminal of a different flip-flop placed on the left thereof (in FIG. 15), through a clock terminal. Also, each of the flip-flops may receive a signal output from a Q' terminal through a D terminal. Each flip-flop may be toggled whenever a pulse is input to a clock terminal. In detail, each flip-flop may be toggled every rising edge of the pulse input to the clock terminal. However, the inventive concepts are not limited thereto. Each flip-flop may be toggled every falling edge of the pulse. According to the above configuration, a cycle of a signal $D_n$ output from a Q terminal of an n-th flip-flop may be $2^n$ times the extension cycle.

The second counter 1233_1 may output signals $D_0$ to $D_n$ to the selection circuit 1233_3.

The decoder 1233_2 may receive the upper bit code DT<0:2>. The decoder 1233_2 may decode the upper bit code DT<0:2> and may generate a selection code DT_sel<0:7>.

The selection circuit 1233_3 may receive the signals $D_0$ to $D_n$ and the selection code DT_sel<0:7>. The selection circuit 1233_3 may select one of the signals $D_0$ to $D_n$, based on the selection code DT_sel<0:7>. In detail, the selection circuit 1233_3 may match bits $DT\_sel_0$ to $DT\_sel_7$ of the selection code DT_sel<0:7> to the signals $D_0$ to $D_n$, respectively. The selection circuit 1233_3 may select a signal matched to a bit indicating a logic value of "1" from among the bits $DT\_sel_0$ to $DT\_sel_7$.

For example, in the case where the upper bit code DT<0:2> indicates a value of i, the bit $DT\_sel_{i-1}$ may indicate 1, and the remaining bits may indicate 0. In this case, the signal $D_{i-1}$ may be selected. A cycle of the selected signal $D_{i-1}$ may be $2^{i-1}$ times the extension cycle. In the descriptions below, a selected signal is expressed as the refresh signal rs0. The selection circuit 1233_3 may output the refresh signal rs0. Here, "i" may be a natural number that is 1 or more and 7 or less.

Figure 16:
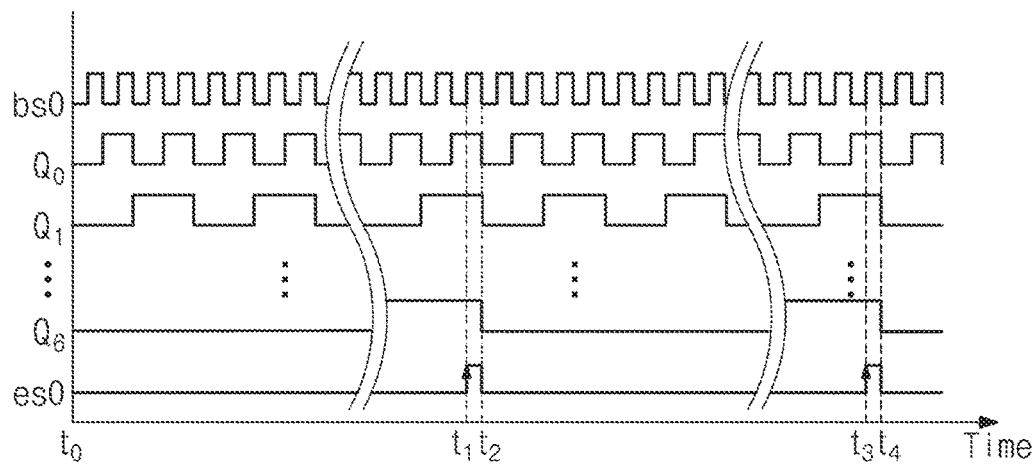
FIG. 16 is a timing diagram for describing an extension signal of FIG. 14.

FIG. 16 is a timing diagram for describing an extension signal of FIG. 14.

The comparator 1232_2 of FIG. 14 may output the extension signal es0 at a time $t_1$ when the first count code Qcode<0:6> is matched to the lower bit code CT<0:5:High>. Also, after outputting the extension signal es0, the comparator 1232_2 may reset the first counter 1232_1 of FIG. 14 at a time $t_2$.

When the first counter 1232_1 is reset, logic values of all the signals $Q_0$ to $Q_6$ may be set to "0". After the first counter 1232_1 is reset, between the time $t_2$ and a time $t_4$, the first frequency demultiplier 1232 may again perform an operation, which is performed between the time t0 and the time $t_2$. That is, the operation performed between the time $t_2$ and the time $t_4$ may correspond to the operation performed between the time $t_0$ and the time $t_2$.

Accordingly, the extension signal es0 may be output every extension cycle $t_2$-$t_0$. The extension cycle of the extension signal es0 may be expressed as $t_4$-$t_2$.

As described with reference to FIG. 14, the lower bit code CT<0:5> may be transformed to the lower bit code CT<0:5:High> to which the uppermost bit having a logic value of "1" is added. A cycle that the lower bit code CT<0:5:High> indicates is longer than a cycle that the lower bit code CT<0:5> indicates. Accordingly, the first frequency demultiplier 1232 may make the extension cycle longer by using the lower bit code CT<0:5>. The extension cycle may be between a cycle that the code of "1000000" indicates and a cycle that the code of "1111111" indicates.

Figure 17:
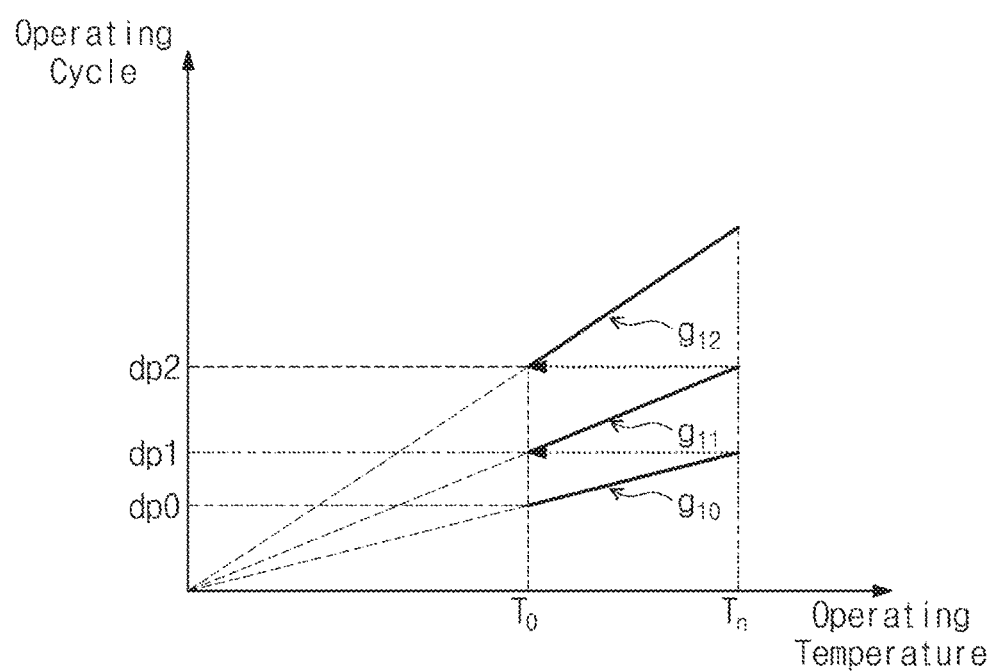
FIG. 17 is a graph for describing a refresh signal of FIG. 15.

FIG. 17 is a graph for describing a refresh signal of FIG. 15.

An operating cycle that the refresh signal rs0 of FIG. 15 may have will be described with reference to a graph illustrated in FIG. 17. However, for convenience of description, only waveforms of the signals $D_0$ to $D_2$ are illustrated, and waveforms of the remaining signals $D_3$ to $D_7$ are omitted.

A graph $g_{10}$ may indicate a waveform of the extension signal es0. An extension cycle of the extension signal es0 may be between "dp0" and "dp1". The extension signal es0 may have the cycle "dp0" when the lower bit code CT<0:5:High> is "1000000" and may have the cycle "dp1" when the lower bit code CT<0:5:High> is "1111111". Because the waveform of the signal $D_0$ is identical to the waveform of the extension signal es0, the graph $g_{10}$ also indicate the waveform of the signal $D_0$. That is, the cycle "dp0" may be an operating cycle when the lower bit code CT<0:5:High> is "1000000" and the signal $D_0$ is selected. Also, the cycle "dp1" may be an operating cycle when the lower bit code CT<0:5:High> is "1111111" and the signal $D_0$ is selected.

A graph $g_{11}$ may indicate a waveform of the signal $D_1$. A cycle of the signal $D_1$ may be two times a cycle that the extension signal es0 has. That is, a slope of the graph $g_{11}$ may be two times a slope of the graph $g_{10}$. A cycle of the signal $D_1$ may be between "dp1" and "dp2". In detail, the cycle "dp1" may be an operating cycle when the lower bit code CT<0:5:High> is "1000000" and the signal $D_1$ is selected. Also, the cycle "dp2" may be an operating cycle when the lower bit code CT<0:5:High> is "1111111" and the signal $D_1$ is selected.

In other words, the second frequency demultiplier 1233 of FIG. 15 may output the refresh signal rs0 having a cycle between "dp0" and "dp1" by using the signal $D_0$ and may output the refresh signal rs0 having a cycle between "dp1" and "dp2" by using the signal $D_1$. This means that ranges of cycles that the signals $D_0$ to $D_7$ can be output are continuous and do not overlap. That is, the cycle adjusting circuit 1230 of FIG. 13 may further widen a range of a cycle that the refresh signal rs0 can be output, by using the lower bit code CT<0:5:High> appropriately transformed. Also, the cycle adjusting circuit 1230 may easily adjust a cycle of the refresh signal rs0.

Figure 18:
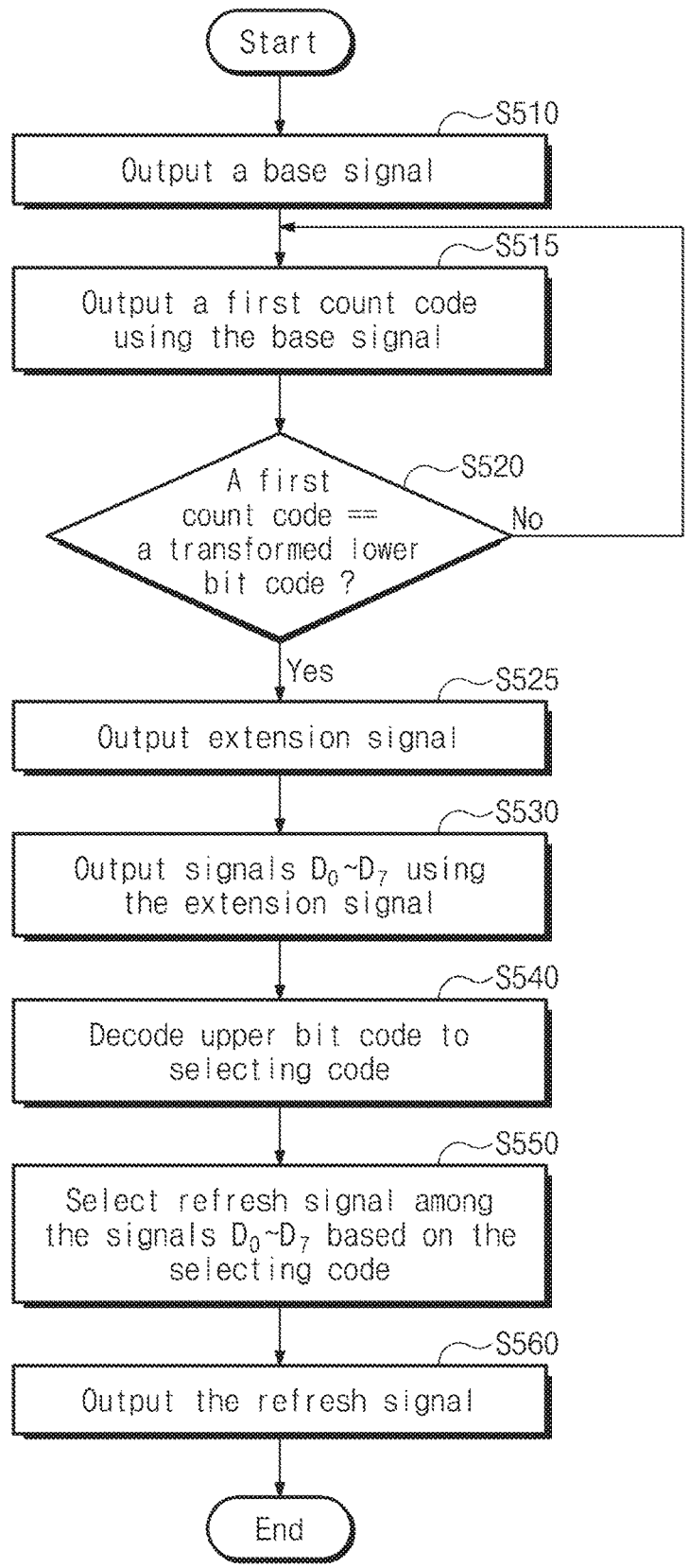
FIG. 18 is a flowchart for describing an operation of a cycle adjusting circuit of FIG. 13.

FIG. 18 is a flowchart for describing an operation of a cycle adjusting circuit 1230 of FIG. 13.

In operation S510, the oscillator 1231 of FIG. 13 may output the base signal bs0.

In operation S515, the first frequency demultiplier 1232 of FIG. 13 may generate the first count code Qcode<0:6> by using the base signal bs0.

In operation S520, the first frequency demultiplier 1232 of FIG. 13 may compare the lower bit code CT<0:5:High> and the first count code Qcode<0:6>. The lower bit code CT<0:5:High> is described with reference to FIG. 14, and thus, additional description will be omitted to avoid redundancy.

When the lower bit code CT<0:5:High> is not matched to the first count code Qcode<0:6>, operation S515 and operation S520 are again performed.

When the lower bit code CT<0:5:High> is matched to the first count code Qcode<0:6>, operation S525 is performed. In operation S525, the first frequency demultiplier 1232 may output the extension signal es0.

In operation S530, the second frequency demultiplier 1233 of FIG. 13 may output the signals $D_0$ to $D_7$ by using the extension signal es0.

In operation S540, the second frequency demultiplier 1233 may decode the upper bit code DT<0:2> and may generate the selection code DT_sel<0:7>.

In operation S550, the second frequency demultiplier 1233 may select one of the signals $D_0$ to $D_7$ as the refresh signal rs0, based on the selection code DT_sel<0:7>.

In operation S560, the second frequency demultiplier 1233 may output the selected refresh signal rs0.

Figure 19:
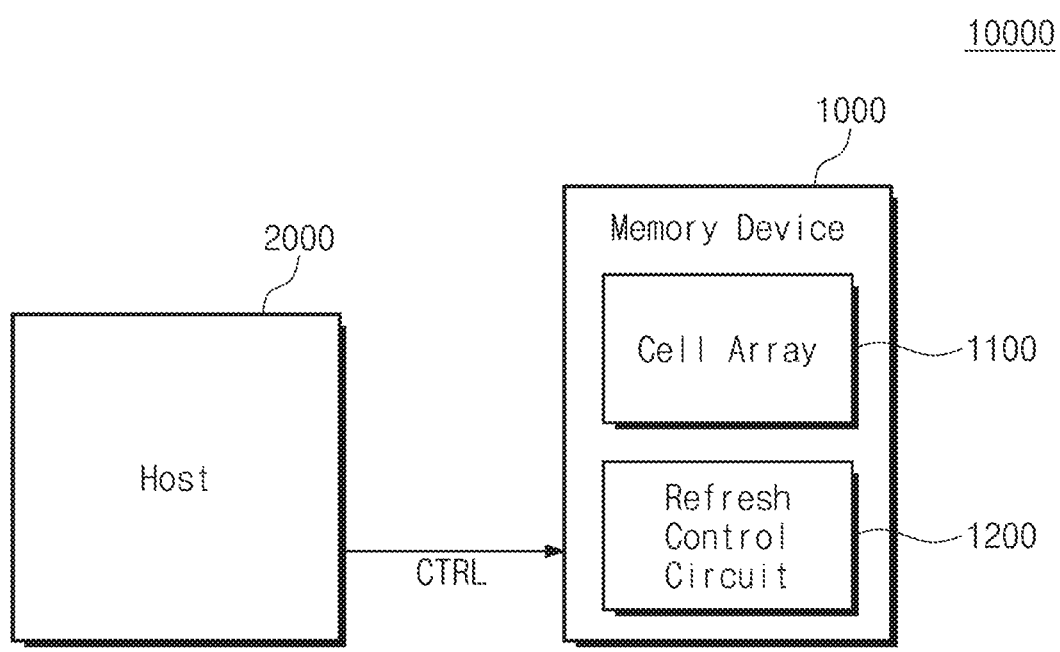
FIG. 19 is a block diagram for describing an operation of an electronic device according to an embodiment of the inventive concepts.

FIG. 19 is a block diagram for describing an operation of an electronic device 10000 according to an embodiment of the inventive concepts.

The electronic device 10000 may include the host 2000 and a memory device 1000. For example, the electronic device 10000 may be a single system including both the host 2000 and the memory device 1000. Alternatively, the host 2000 and the memory device 1000 of the electronic device 10000 may be implemented with separate devices, respectively. The memory device 1000 may provide substantially the same operations as the memory device 1000 of FIG. 2.

For example, the host 2000 may be a processor circuit including a general-purpose processor or an application processor or an electronic device. In some embodiments, the host 2000 may be the following computing device including one or more processors: a personal computer, a peripheral device, a digital camera, personal digital assistant (PDA), a portable media player (PMP), a smartphone, a tablet, or a wearable device. However, the above examples do not limit the inventive concepts.

The memory device 1000 may be implemented with any storage medium including a volatile and/or volatile memory. For example, the memory device 1000 may include a dynamic random access memory (DRAM), a static random access memory (SRAM), a thyristor RAM (TRAM), a zero capacitor RAM (Z-RAM), a twin transistor RAM (TTRAM), a magnetoresistive RAM (MRAM), an unbuffered dual in-line memory module (UDIMM), a registered DIMM (RDIMM), a load reduced DIMM (LRDIMM), Non Volatile DIMM (NVDIMM), etc. The above are only examples for helping understand the inventive concepts and are not intended to limit the inventive concepts.

The memory device 1000 may communicate with the host 2000. The host 2000 may control a refresh operation of the memory device 1000. In detail, the host 2000 may output a control signal for changing temperature-slope data of the memory device 1000 depending on a power condition of the electronic device 10000. Because the amount of temperature-slope data is relatively small, the memory device 1000 may transform the temperature-slope data under control of the host 2000. The memory device 1000 may transform the temperature-slope data under control of the host 2000 such that the temperature-slope data indicate a new correspondence relationship.

Accordingly, the memory device 1000 may adjust an operating cycle depending on an operating temperature in the case of further decreasing a refresh operating cycle or further increasing the refresh operating temperature, due to a power issue.

According to an embodiment of the inventive concepts, a memory device may adjust an operating cycle depending on an operating temperature, by using temperature-slope data associated with the rate of change of an operating cycle relative to a change of an operating temperature. That is, the memory device may adjust an operating cycle depending on an operating temperature by using a relatively less amount of data.

While the inventive concepts have been described with reference to example embodiments thereof, it will be apparent to those of ordinary skill in the art that various changes and modifications may be made thereto without departing from the scope of the inventive concepts as set forth in the following claims.

What is claimed is:

1. A memory device comprising:
   a cell array; and
   a cycle calculating circuit configured to calculate an operating cycle of a refresh operation to be performed at the cell array based on an operating temperature of the memory device,
   wherein, responsive to the operating temperature being lower than a first temperature, the cycle calculating circuit is configured to calculate the operating cycle by integrating one or more slope values of a second slope value to an $n^{th}$ slope value that are arranged from a highest temperature to a lowest temperature,
   wherein the second slope value corresponds to a second temperature,
   wherein the $n^{th}$ slope value corresponds to an $n^{th}$ temperature,
   wherein n is a natural number of 2 or more, and
   wherein a number of the one or more slope values is based on the operating temperature.

2. The memory device of claim 1, wherein the second slope value to the $n^{th}$ slope value are based on a rate of change of the operating cycle of the refresh operation relative to a temperature change in each of a plurality of temperature ranges to which the second temperature to the $n^{th}$ temperature belong.

3. The memory device of claim 1, wherein first slope values of the one or more slope values that correspond to temperatures, to which a same temperature range belongs, from among the second temperature to the $n^{th}$ temperature are identical.

4. The memory device of claim 1, wherein, in response to the operating temperature being a $k^{th}$ temperature, the cycle calculating circuit is further configured to calculate the operating cycle by integrating the second slope value to a $k^{th}$ slope value,
wherein the $k^{th}$ temperature is one of the second temperature to the $n^{th}$ temperature, and
wherein k is a natural number of 2 or more and the n or less.

5. The memory device of claim 1, further comprising:
a temperature sensing circuit configured to sense the operating temperature and to generate temperature data associated with the operating temperature,
wherein the cycle calculating circuit is further configured to compare the operating temperature and the first temperature based on the temperature data.

6. The memory device of claim 1, wherein the cycle calculating circuit comprises storage, and
wherein the storage comprises temperature-slope data indicating a correspondence relationship between the second temperature to the $n^{th}$ temperature and the second slope value to the $n^{th}$ slope value.

7. The memory device of claim 6, wherein the cycle calculating circuit is further configured to transform the temperature-slope data under control of a host remote from the memory device, such that the temperature-slope data indicate a new correspondence relationship.

8. The memory device of claim 1, wherein the cycle calculating circuit is further configured to output an operating cycle code indicating the operating cycle that is calculated by the cycle calculating circuit, and
wherein the memory device further comprises:
a cycle adjusting circuit configured to transform a base signal having a base cycle into a refresh signal having the operating cycle, based on the operating cycle code.

9. The memory device of claim 8, wherein the cycle adjusting circuit is further configured to generate a first transformed operating cycle code based on at least one bit of the operating cycle code and to generate a second transformed operating cycle code based on at least one of remaining bits of the operating cycle code.

10. The memory device of claim 9, wherein the cycle adjusting circuit comprises:
a first counter configured to receive the base signal and to output a counting code;
a comparator configured to compare the counting code and the first transformed operating cycle code and to output an extension signal;
a second counter configured to receive the extension signal and to output counting signals; and
a selection circuit configured to select a counting signal having the operating cycle from among the counting signals based on the second transformed operating cycle code and to output the refresh signal based on the counting signal.

11. The memory device of claim 10, wherein the cycle adjusting circuit is further configured to adjust cycles of the counting signals by adjusting a logic value of the first transformed operating cycle code.

12. A memory device comprising:
a cell array; and
a cycle calculating circuit configured to calculate an operating cycle of a refresh operation to be performed at the cell array based on an operating temperature of the memory device,
wherein the cycle calculating circuit comprises:
a code generating circuit configured to output a first temperature code and to subsequently output a second temperature code in response to determining that an operating temperature code indicating the operating temperature is not matched to the first temperature code;
a matching circuit configured to output a slope value corresponding to the second temperature code; and
an integrating circuit configured to calculate a second cycle corresponding to the second temperature code by adding the slope value to a first cycle corresponding to the first temperature code.

13. The memory device of claim 12, wherein a first number of bits indicating the slope value is less than a second number of bits indicating the operating cycle.

14. The memory device of claim 12, wherein the slope value is associated with a rate of change of the operating cycle of the refresh operation relative to a temperature change in a temperature range to which the second temperature code belongs.

15. The memory device of claim 12, wherein a temperature that the first temperature code indicates is higher than a temperature that the second temperature code indicates.

16. The memory device of claim 12, wherein a first logic value of the second temperature code is greater than a second logic value of the first temperature code.

17. The memory device of claim 12, wherein the matching circuit is further configured to obtain the slope value, based on temperature-slope data indicating a correspondence relationship between the second temperature code and the slope value.

18. A memory device comprising:
a cell array; and
a cycle calculating circuit configured to calculate an operating cycle of a refresh operation to be performed at the cell array based on an operating temperature of the memory device,
wherein the cycle calculating circuit comprises:
a comparator configured to output a control signal of a first logic value in response to the operating temperature not matching a first temperature;
a matching circuit configured to output a slope value corresponding to a second temperature in response to the operating temperature not matching the first temperature; and
an integrating circuit configured to calculate a second cycle corresponding to the second temperature by adding the slope value to a first cycle corresponding to the first temperature, in response to receiving the control signal of the first logic value.

19. The memory device of claim 18, wherein the second temperature is lower than the first temperature.

20. The memory device of claim 18, wherein, in response to the operating temperature matching the second temperature, the comparator is further configured to output the control signal having a second logic value that is different from the first logic value, and
wherein, in response to receiving the control signal of the second logic value, the integrating circuit is further configured to be reset after outputting an operating cycle code indicating the second cycle.

* * * * *